(12) United States Patent
Sakai et al.

(10) Patent No.: US 7,897,211 B2
(45) Date of Patent: Mar. 1, 2011

(54) METHOD FOR FORMING FILM PATTERN AND METHOD FOR MANUFACTURING AN ORGANIC EL DEVICE, A COLOR FILTER SUBSTRATE AND A LIQUID CRYSTAL DISPLAY DEVICE

(75) Inventors: Hirofumi Sakai, Nagano (JP); Takaya Tanaka, Suwa (JP)

(73) Assignee: Seiko Epson Corporation (JP)

( * ) Notice: Subject to any disclaimer, the term of this patent is extended or adjusted under 35 U.S.C. 154(b) by 924 days.

(21) Appl. No.: 11/470,673

(22) Filed: Sep. 7, 2006

(65) Prior Publication Data

US 2007/0052119 A1    Mar. 8, 2007

(30) Foreign Application Priority Data

Sep. 8, 2005  (JP) .................................. 2005-260320
Aug. 23, 2006  (JP) .................................. 2006-226141

(51) Int. Cl.
*B05D 5/00* (2006.01)
*B05D 5/06* (2006.01)
*B05D 1/02* (2006.01)

(52) U.S. Cl. ...................... 427/256; 427/66; 427/421.1

(58) Field of Classification Search .................. 427/66, 427/256, 287, 421.1
See application file for complete search history.

(56) References Cited

U.S. PATENT DOCUMENTS

| 2001/0001050 | A1* | 5/2001 | Miyashita et al. | 428/690 |
| 2002/0064966 | A1* | 5/2002 | Seki et al. | 438/780 |
| 2002/0105080 | A1* | 8/2002 | Speakman | 257/749 |
| 2003/0030766 | A1* | 2/2003 | Kiguchi et al. | 349/106 |
| 2005/0161665 | A1* | 7/2005 | Winters et al. | 257/40 |
| 2005/0212841 | A1* | 9/2005 | Okano | 347/13 |

FOREIGN PATENT DOCUMENTS

| JP | 11-054270 | 2/1999 |
| JP | 2001-291587 | 10/2001 |
| JP | 2002-222695 | 8/2002 |
| JP | 2003-245582 | 9/2003 |
| JP | 2004-031360 | 1/2004 |
| JP | 2004-127897 | 4/2004 |
| JP | 2004-311206 | 11/2004 |
| JP | 2004-330136 | 11/2004 |

* cited by examiner

*Primary Examiner* — Timothy H Meeks
*Assistant Examiner* — James Lin
(74) *Attorney, Agent, or Firm* — Harness, Dickey & Pierce, P.L.C.

(57) ABSTRACT

A method for forming a film pattern made of a high-performance material by arranging a functional fluid on a base substrate and drying the functional fluid, the functional fluid being the high-performance material dissolved or dispersed in a solvent is provided. The method includes: forming liquid reception portions in an effective area and a non-effective area of the base substrate on which the film pattern is to be formed, the non-effective area surrounding the effective area; arranging the functional fluid in the liquid reception portions formed in the effective area; and arranging the functional fluid or the solvent in the liquid reception portions formed in the non-effective area, wherein, in the non-effective area, larger amounts of the solvent are arranged in the liquid reception portions in areas that are more distant from a center of the effective area.

11 Claims, 16 Drawing Sheets

METHOD FOR FORMING FILM PATTERN AND METHOD FOR MANUFACTURING AN ORGANIC EL DEVICE, A COLOR FILTER SUBSTRATE AND A LIQUID CRYSTAL DISPLAY DEVICE

BACKGROUND

1. Technical Field

The present invention relates to a method for forming a film pattern and a method for manufacturing an organic EL device, a color filter substrate and a liquid crystal display device.

2. Related Art

In recent years, development of organic electroluminescent devices (hereinafter referred to as "organic EL devices") having a structure in which a functional layer of a high-performance material is sandwiched between a pair of electrodes has been proceeding. In particular, development of organic EL devices employing an organic light-emitting material as the high-performance material has been proceeding (see, for example, JP-A-11-54270, JP-A-2001-291587, JP-A-2004-31360, and JP-A-2004-127897). In manufacturing such devices, there has been adopted a method of patterning the high-performance material using a droplet discharge method. In this method, a high-performance material, such as an organic fluorescent material or the like, is converted into ink form and the ink (i.e., a functional fluid) is discharged onto a base substrate. Development of methods of drying the ink (i.e., the functional fluid) has also been proceeding (see for example, JP-A-2003-245582, JP-A-2004-311206, and JP-A-2004-330136).

An exemplary method of patterning the high-performance material to form the functional layer on a pixel electrode is as follows: first, forming a partition called a bank around the pixel electrode of ITO or the like formed on the base substrate; then, treating the pixel electrode and a portion of the bank adjacent to the pixel electrode so that they have affinity for liquid and treating the remaining portion of the bank so that it becomes liquid-repellent; and thereafter, discharging ink containing a material for the functional layer onto the pixel electrode and drying the ink. More specifically, there is known a method of forming the functional layer on the pixel electrodes by using a droplet discharge head having a row of nozzles arranged in a sub-scanning direction and discharging ink from the nozzles while causing the droplet discharge head to scan the base substrate in a main scanning direction. Such a method makes it possible to arrange droplets on the order of microns on pixel areas. Therefore, in view of efficiency in use of the material, such a method is more effective than other methods such as spin coating.

However, the partial pressure of solvent molecules, which evaporate from the ink, may become higher in a peripheral portion of a display area (i.e., an effective area) where the pixel electrodes are arranged than in a central portion of the display area. If such a phenomenon occurs, the evaporation rate of the solvent may become extremely high in the peripheral portion of the display area, resulting in unevenness in film thickness of the functional layer or film inclination (i.e., a state in which a film in cross section is tilted) within a pixel in an organic EL device as manufactured. An organic EL device involving such unevenness in film thickness has reduced performance, and if that organic EL device is used as a display device or the like, display unevenness may occur. As such, a technique to solve such a problem is disclosed in JP-A-2002-222695, for example.

JP-A-11-54270 is a first example of related art.
JP-A-2001-291587 is a second example of related art.
JP-A-2004-31360 is a third example of related art.
JP-A-2004-127897 is a fourth example related art.
JP-A-2002-222695 is a fifth example of related art.
JP-A-2003-245582 is a sixth example of related art.
JP-A-2004-311206 is a seventh example of related art.
JP-A-2004-330136 is an eight example of related art.

The technique disclosed in the fifth example of related art is to form a dummy area (i.e., a non-effective area) that does not contribute to display in an area outside the display area and apply to the dummy area the same ink used for the functional layer, thereby reducing variations in the partial pressure of the solvent molecules within the display area. Typically, a bank of the same pattern is formed in both the dummy area and the display area, and the ink is applied to openings of the bank. According to this method, drying of the solvent progresses at an equal rate in both the central and peripheral portions of the display area, making it possible to form high-quality films that do not involve unevenness in film thickness of the functional layer or film inclination.

Because the ink discharged on the dummy area does not form a pixel used for display, a pixel in the dummy area is sometimes called a dummy pixel, as distinguished from a pixel (i.e., an effective pixel) formed in the display area. In order to prevent the above-described unevenness in film thickness, at least several to tens of rows of dummy pixels need be formed. In related art, however, because all dummy pixels are formed with the same pitch and pattern as those of the effective pixels, simply applying the ink to the dummy area in the same manner as to the display area does not always succeed in eliminating the unevenness in film thickness to a sufficient extent. In other words, because drying of the ink discharged on the base substrate progresses from the periphery toward the center concentrically, in the case of a rectangular display area, for example, drying of the solvent sometimes progresses at a higher rate at corner portions of the rectangular display area than at other portions thereof, resulting in failure to avoid the unevenness in film thickness to a sufficient extent.

SUMMARY

An advantage of the invention is to provide a method for forming a film pattern and a method for manufacturing an organic EL device, a color filter substrate and a liquid crystal display device, in which the pattern has even film thickness throughout a substrate surface.

One aspect of the invention is a method for forming a film pattern made of a high-performance material by arranging a functional fluid on a base substrate and drying the functional fluid, the functional fluid being the high-performance material dissolved or dispersed in a solvent. The method includes: forming liquid reception portions in an effective area and a non-effective area of the base substrate on which the film pattern is to be formed, the non-effective area surrounding the effective area; arranging the functional fluid in the liquid reception portions formed in the effective area; and arranging the functional fluid or the solvent in the liquid reception portions formed in the non-effective area, wherein, in the non-effective area, larger amounts of the solvent are arranged in the liquid reception portions in areas that are more distant from a center of the effective area.

According to this method, because, in the non-effective area, larger amounts of the solvent are arranged in the liquid reception portions in areas that are more distant from the center of the effective area, the partial pressure of solvent molecules is not reduced abruptly even in corner portions or the like of the effective area, where drying progresses rapidly.

Thus, it is possible to equalize the partial pressure of the solvent molecules (which are evaporated) throughout the effective area. That is, in related art techniques, since the same amount of the solvent is simply arranged onto all liquid reception portions, which are formed to have the same pitch and size, the solvent is dried too rapidly in the corner portions of the effective area, which are the most distant from the center thereof. In contrast, in the above-described method, because the amount of the solvent is increased at the corner portions or the like of the effective area, where drying progresses rapidly and the partial pressure of the solvent molecules is inclined to be reduced abruptly, variations do not occur in duration period of the solvent within the effective area. Thus, a drying rate becomes equalized throughout the effective area, resulting in formation of high-quality films without unevenness in film thickness or film inclination.

In the above-described method, the amount of the solvent arranged in the liquid reception portions in the non-effective area may have three or more levels set for the areas of the non-effective area depending on the distance from the center of the effective area.

In this case, it is possible to form the film pattern with less unevenness in drying.

In the above-described method, in the non-effective area, the largest amount of the solvent may be arranged in the liquid reception portions at a corner portion of the effective area having a rectangular shape.

In this case, it is possible to eliminate unevenness in film thickness at the corner portion of the effective area, which is the most problematic in related art, and form uniform films throughout the effective area.

In the above-described method, the liquid reception portions may be areas defined by a partition.

In this case, because the shape of the film pattern is defined by the partition, finer or thinner film patterns can be aimed at by forming the partitions appropriately, such as making the interval between adjacent partitions smaller, for example.

In the above-described method, the size of the liquid reception portions in the effective area may be substantially identical to the size of the liquid reception portions in the non-effective area.

In this case, arrangement of the functional fluid or the solvent can be performed on both the non-effective area and the effective area under the same condition.

In the above-described method, the size of the liquid reception portions in the non-effective area may be larger than the size of the liquid reception portions in the effective area.

In this case, it is possible to arrange a sufficient amount of the solvent in the liquid reception portions in the non-effective area.

In the above-described method, in the non-effective area, the liquid reception portions in areas that are more distant from the center of the effective area may have larger sizes.

In this case, because the liquid reception portions in which larger amounts of the solvent are arranged (i.e., the liquid reception portions that are more distant from the center of the effective area) are formed to have larger sizes, it is possible to prevent a problem oft e.g., overflow of the solvent in the liquid reception portions far from the center of the effective area. Also, since the solvent arranged in the liquid reception portion spreads to have the size of the liquid reception portion because of flowing, the solvent achieves a larger surface area in areas at, e.g., the corner portion of the effective area, where drying progresses rapidly and the partial pressure of the solvent molecules is inclined to be reduced abruptly. The partial pressure of the solvent molecules depends on the surface area of the discharged solvent, and the greater the surface area is, the higher the partial pressure of the solvent molecules (which are evaporated) becomes. Since the surface area of the solvent is adjusted by varying the size of the liquid reception portions and the amount of the solvent to prevent variations in the partial pressure of the solvent molecules within the effective area, it is possible to form films with greater uniformity.

In the above-described method, the interval between adjacent liquid reception portions (i.e., the alignment pitch of the liquid reception portions) in the effective area may be substantially identical to the interval between adjacent liquid reception portions in the non-effective area.

In this case, the arrangement of the functional fluid or the solvent can be performed on both the non-effective area and the effective area under the same condition. In particular, in the case where the functional fluid or the solvent is discharged using a droplet discharge method, it is possible to perform the discharge successively without the need to change a discharge pitch between the effective area and the non-effective area, resulting in an easier procedure.

In the above-described method, the liquid reception portions in the non-effective area may be formed in at least two rows along a periphery of the effective area.

In this case, it is possible to prevent unevenness in drying with more certainty.

In the above-described method, arrangement of the functional fluid or the solvent may be performed employing a droplet discharge method.

In this case, because of the use of the droplet discharge method, the liquid material is consumed less wastefully as compared with other application techniques such as spin coating, and it is easier to control the amounts and positions of the liquid material arranged on the base substrate.

Another aspect of the invention is a method for manufacturing an organic EL device having a film pattern formed of a high-performance material by arranging a functional fluid on a base substrate and drying the functional fluid, the functional fluid being the high-performance material dissolved or dispersed in a solvent. The method includes: forming liquid reception portions in an effective area and a non-effective area of the base substrate on which the film pattern is to be formed, the non-effective area surrounding the effective area; arranging the functional fluid in the liquid reception portions formed in the effective area, and arranging the functional fluid or the solvent in the liquid reception portions formed in the non-effective area, wherein, in the non-effective area, larger amounts of the solvent are arranged in the liquid reception portions in areas that are more distant from the center of the effective area.

According to this method, because the amount of the solvent is increased at the corner portions or the like of the effective area, where drying progresses rapidly and the partial pressure of the solvent molecules is inclined to be reduced abruptly, variations do not occur in duration period of the solvent within the effective area. Thus, a drying rate becomes equalized throughout the effective area, and it is possible to manufacture an organic EL device having a high-quality film pattern without unevenness in film thickness or film inclination.

In the above-described method for manufacturing an organic EL device, the amount of the solvent arranged in the liquid reception portions in the non-effective area may have three or more levels set for the areas of the non-effective area depending on the distance from the center of the effective area.

In this case, it is possible to manufacture an organic EL device having a film pattern with less unevenness in drying.

In the above-described method for manufacturing an organic EL device, in the non-effective area, the largest amount of the solvent may be arranged in the liquid reception portions at a corner portion of the effective area having a rectangular shape.

In this case, it is possible to eliminate unevenness in film thickness at the corner portion of the effective area, which is the most problematic in related art, and thus to manufacture an organic EL device having a film pattern that is uniform throughout the effective area.

In the above-described method for manufacturing an organic EL device, the liquid reception portions may be areas defined by a partition.

In this case, because the shape of the film pattern is defined by the partition, it is possible to manufacture an organic EL device having a finer or thinner film pattern, which may be achieved by forming the partitions appropriately, such as making the interval between adjacent partitions smaller, for example.

In the above-described method for manufacturing an organic EL device, the size of the liquid reception portions in the effective area may be substantially identical to the size of the liquid reception portions in the non-effective area.

In this case, it is possible to manufacture an organic EL device having a film pattern in the formation of which the arrangement of the functional fluid or the solvent can be performed on both the non-effective area and the effective area under the same condition.

In the above-described method for manufacturing an organic EL device, the size of the liquid reception portions in the non-effective area may be larger than the size of the liquid reception portions in the effective area.

In this case, it is possible to manufacture an organic EL device having a film pattern in the formation of which a sufficient amount of the solvent can be arranged in the liquid reception portions in the non-effective area.

In the above-described method for manufacturing an organic EL device, in the non-effective area, the liquid reception portions in areas that are more distant from the center of the effective area may have larger sizes.

In this case, since the surface area of the solvent is adjusted by varying the size of the liquid reception portions and the amount of the solvent to prevent variations in the partial pressure of the solvent molecules within the effective area, it is possible to manufacture an organic EL device having a film pattern with greater uniformity.

In the above-described method for manufacturing an organic EL device, the interval between adjacent liquid reception portions in the effective area may be substantially identical to the interval between adjacent liquid reception portions in the non-effective area.

In this case, it is possible to manufacture an organic EL device having a film pattern in the formation of which the arrangement of the functional fluid or the solvent can be performed on both the non-effective area and the effective area under the same condition.

In the above-described method for manufacturing an organic EL device, the liquid reception portions in the non-effective area may be formed in at least two rows along a periphery of the effective area.

In this case, it is possible to manufacture an organic EL device having a film pattern in the formation of which unevenness in drying can be prevented with more certainty.

In the above-described method for manufacturing an organic EL device, arrangement of the functional fluid or the solvent may be performed employing a droplet discharge method.

In this case, because of the use of the droplet discharge method, the liquid material is consumed less wastefully as compared with other application techniques such as spin coating, and it is possible to manufacture an organic EL device having a film pattern in the formation of which the amounts and positions of the liquid material to be arranged on the base substrate can be controlled.

Further, another aspect of the invention is a method for manufacturing a color filter substrate having a film pattern formed of a high-performance material by arranging a functional fluid on a base substrate and drying the functional fluid, the functional fluid being the high-performance material dissolved or dispersed in a solvent. The method includes: forming liquid reception portions in an effective area and a non-effective area of the base substrate on which the film pattern is to be formed, the non-effective area surrounding the effective area; arranging the functional fluid in the liquid reception portions formed in the effective area; and arranging the functional fluid or the solvent in the liquid reception portions formed in the non-effective area, wherein, in the non-effective area, larger amounts of the solvent are arranged in the liquid reception portions in areas that are more distant from the center of the effective area.

According to this method, because the amount of the solvent is increased at the corner portions or the like of the effective area, where drying progresses rapidly and the partial pressure of the solvent molecules is inclined to be reduced abruptly, variations do not occur in duration period of the solvent within the effective area. Thus, a drying rate becomes equalized throughout the effective area, and it is possible to manufacture a color filter substrate having a high-quality film pattern without unevenness in film thickness or film inclination.

In the above-described method for manufacturing a color filter substrate, the amount of the solvent arranged in the liquid reception portions in the non-effective area may have three or more levels set for the areas of the non-effective area depending on the distance from the center of the effective area.

In this case, it is possible to manufacture a color filter substrate having a film pattern with less unevenness in drying.

In the above-described method for manufacturing a color filter substrate, in the non-effective area, the largest amount of the solvent may be arranged in the liquid reception portions at a corner portion of the effective area having a rectangular shape.

In this case, it is possible to eliminate unevenness in film thickness at the corner portion of the effective area, which is the most problematic in related art, and thus to manufacture a color filter substrate having a film pattern that is uniform throughout the effective area.

In the above-described method for manufacturing a color filter substrate, the liquid reception portions may be areas defined by a partition.

In this case, because the shape of the film pattern is defined by the partition, it is possible to manufacture a color filter substrate having a finer or thinner film pattern, which may be achieved by forming the partitions appropriately, such as making the interval between adjacent partitions smaller, for example.

In the above-described method for manufacturing a color filter substrate, the size of the liquid reception portions in the effective area may be substantially identical to the size of the liquid reception portions in the non-effective area.

In this case, it is possible to manufacture a color filter substrate having a film pattern in the formation of which the arrangement of the functional fluid or the solvent can be performed on both the non-effective area and the effective area under the same condition.

In the above-described method for manufacturing a color filter substrate, the size of the liquid reception portions in the non-effective area may be larger than the size of the liquid reception portions in the effective area.

In this case, it is possible to manufacture a color filter substrate having a film pattern in the formation of which a sufficient amount of the solvent can be arranged in the liquid reception portions in the non-effective area.

In the above-described method for manufacturing a color filter substrate, in the non-effective area, the liquid reception portions in areas that are more distant from the center of the effective area may have larger sizes.

In this case, since the surface area of the solvent is adjusted by varying the size of the liquid reception portions and the amount of the solvent to prevent variations in the partial pressure of the solvent molecules within the effective area, it is possible to manufacture a color filter substrate having a film pattern with greater uniformity.

In the above-described method for manufacturing a color filter substrate, the interval between adjacent liquid reception portions in the effective area may be substantially identical to the interval between adjacent liquid reception portions in the non-effective area.

In this case, it is possible to manufacture a color filter substrate having a film pattern in the formation of which the arrangement of the functional fluid or the solvent can be performed on both the non-effective area and the effective area under the same condition.

In the above-described method for manufacturing a color filter substrate, the liquid reception portions in the non-effective area may be formed in at least two rows along a periphery of the effective area.

In this case, it is possible to manufacture a color filter substrate having a film pattern in the formation of which unevenness in drying can be prevented with more certainty.

In the above-described method for manufacturing a color filter substrate, arrangement of the functional fluid or the solvent may be performed employing a droplet discharge method.

In this case, because of the use of the droplet discharge method, the liquid material is consumed less wastefully as compared with other application techniques such as spin coating, and it is possible to manufacture a color filter substrate having a film pattern in the formation of which the amounts and positions of the liquid material to be arranged on the base substrate can be controlled.

Yet another aspect of the invention is a method for manufacturing a liquid crystal display device including a color filter substrate having a film pattern formed of a high-performance material by arranging a functional fluid on a base substrate and drying the functional fluid, the functional fluid being the high-performance material dissolved or dispersed in a solvent. The method includes: forming liquid reception portions in an effective area and a non-effective area of the base substrate on which the film pattern is to be formed, the non-effective area surrounding the effective area; arranging the functional fluid in the liquid reception portions formed in the effective area; and arranging the functional fluid or the solvent in the liquid reception portions formed in the non-effective area, wherein, in the non-effective area, larger amounts of the solvent are arranged in the liquid reception portions in areas that are more distant from the center of the effective area.

According to this method, because the amount of the solvent is increased at the corner portions or the like of the effective area, where drying progresses rapidly and the partial pressure of the solvent molecules is inclined to be reduced abruptly, variations do not occur in duration period of the solvent within the effective area. Thus, a drying rate becomes equalized throughout the effective area, and it is possible to manufacture a liquid crystal display device with excellent display performance as it includes a color filter substrate having a high-quality film pattern without unevenness in film thickness or film inclination.

In the above-described method for manufacturing a liquid crystal display device, the amount of the solvent arranged in the liquid reception portions in the non-effective area may have three or more levels set for the areas of the non-effective area depending on the distance from the center of the effective area.

In this case, it is possible to manufacture a liquid crystal display device including a color filter substrate having a film pattern with less unevenness in drying.

In the above-described method for manufacturing a liquid crystal display device, in the non-effective area, the largest amount of the solvent may be arranged in the liquid reception portions at a corner portion of the effective area having a rectangular shape.

In this case, it is possible to eliminate unevenness in film thickness at the corner portion of the effective area, which is the most problematic in related art, and thus to manufacture a liquid crystal display device including a color filter substrate having a film pattern that is uniform throughout the effective area.

In the above-described method for manufacturing a liquid crystal display device, the liquid reception portions may be areas defined by a partition.

In this case, because the shape of the film pattern is defined by the partition, it is possible to manufacture a liquid crystal display device including a color filter substrate having a finer or thinner film pattern, which may be achieved by forming the partitions appropriately, such as making the interval between adjacent partitions smaller, for example.

In the above-described method for manufacturing a liquid crystal display device, the size of the liquid reception portions in the effective area may be substantially identical to the size of the liquid reception portions in the non-effective area.

In this case, it is possible to manufacture a liquid crystal display device including a color filter substrate having a film pattern in the formation of which the arrangement of the functional fluid or the solvent can be performed on both the non-effective area and the effective area under the same condition.

In the above-described method for manufacturing a liquid crystal display device, the size of the liquid reception portions in the non-effective area may be larger than the size of the liquid reception portions in the effective area.

In this case, it is possible to manufacture a liquid crystal display device including a color filter substrate having a film pattern in the formation of which a sufficient amount of the solvent can be arranged in the liquid reception portions in the non-effective area.

In the above-described method for manufacturing a liquid crystal display device, in the non-effective area, the liquid reception portions in areas that are more distant from the center of the effective area may have larger sizes.

In this case, since the surface area of the solvent is adjusted by varying the size of the liquid reception portions and the amount of the solvent to prevent variations in the partial pressure of the solvent molecules within the effective area, it is possible to manufacture a liquid crystal display device including a color filter substrate having a film pattern with greater uniformity.

In the above-described method for manufacturing a liquid crystal display device, the interval between adjacent liquid reception portions in the effective area may be substantially identical to the interval between adjacent liquid reception portions in the non-effective area.

In this case, it is possible to manufacture a liquid crystal display device including a color filter substrate having a film pattern in the formation of which the arrangement of the functional fluid or the solvent can be performed on both the non-effective area and the effective area under the same condition.

In the above-described method for manufacturing a liquid crystal display device, the liquid reception portions in the non-effective area may be formed in at least two rows along a periphery of the effective area.

In this case, it is possible to manufacture a liquid crystal display device including a color filter substrate having a film pattern in the formation of which unevenness in drying can be prevented with more certainty.

In the above-described method for manufacturing a liquid crystal display device, arrangement of the functional fluid or the solvent may be performed employing a droplet discharge method.

In this case, because of the use of the droplet discharge method, the liquid material is consumed less wastefully as compared with other application techniques such as spin coating, and it is possible to manufacture a liquid crystal display device including a color filter substrate having a film pattern in the formation of which the amounts and positions of the liquid material to be arranged on the base substrate can be controlled.

Examples of devices that can be manufactured by the method for manufacturing a device according to the invention include an organic electroluminescent device and a color filter substrate, and the method for forming a film pattern according to the invention can be suitably applied to processes of forming patterns of an organic functional layer (i.e., a luminescent layer, a charge transport layer, etc.) and pixel electrodes of the organic electroluminescent device, a color filter pattern of the color filter substrate, and the like.

BRIEF DESCRIPTION OF THE DRAWINGS

The invention will now be described with reference to the accompanying drawings, wherein like numbers reference like elements.

DESCRIPTION OF EXEMPLARY EMBODIMENTS

Embodiments of the invention will now be described.

First Embodiment

Figure 1:
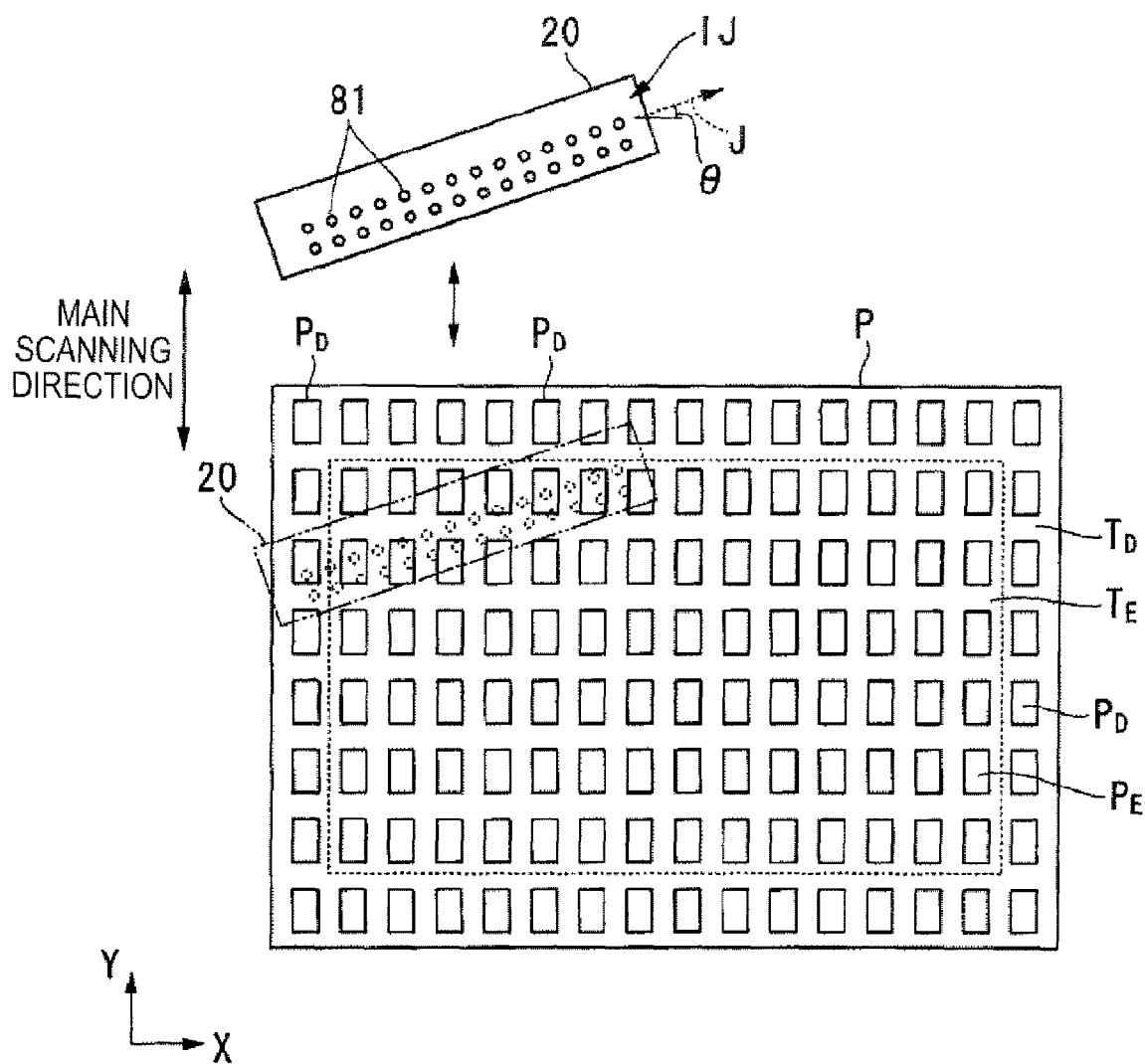
FIG. 1 is a conceptual diagram illustrating a method for forming a film pattern according to one embodiment of the invention.

FIG. 1 is a conceptual diagram illustrating a method for forming a film pattern according to one embodiment of the invention.

In the method for forming a film pattern according to this embodiment of the invention, a functional fluid containing a high-performance material is arranged on a base substrate P, and the functional fluid is dried to form a film pattern formed of the high-performance material on the base substrate P. An area where the film pattern is formed includes an effective area $T_E$, which is formed of a group of film patterns where films carry out their essential function effectively, and a non-effective area $T_D$, which is formed of a group of film patterns where films do not carry out their essential function.

In the case of a display device such as an organic EL display device or the like, for example, the effective area $T_E$ refers to a specific area formed of a group of pixels used for display, and in the case of a color filter substrate used in a liquid crystal display device or the like, the effective area $T_E$ refers to a specific area formed of a group of color filters used for display. Also, in the case of a substrate on which a plurality of electrodes, wires, and the like are formed, the effective area $T_E$ refers to a specific area formed of the plurality of electrodes, the plurality of wires, and the like. In the method for forming a film pattern according to this embodiment of the invention, the functional fluids are selectively arranged on such an effective area $T_E$ to form a group of film patterns having a desired shape and function.

FIG. 1 illustrates a case where the effective area $T_E$ corresponds to an effective optical area formed of a plurality of pixels (i.e., effective pixels) $P_E$ used for display, for example, and the functional fluid containing a high-performance material is selectively discharged onto the plurality of effective pixels $P_E$ in the effective optical area $T_E$ using a droplet discharge method.

In FIG. 1, reference numeral IJ indicates a droplet discharge device, reference numeral 20 indicates a droplet discharge head provided in the droplet discharge device, and reference numeral 81 indicates nozzles provided in the droplet discharge head. Although an alignment direction J of the nozzles 81 is tilted relative to an alignment direction X of the effective pixels $P_E$ in FIG. 1, if an alignment pitch of the nozzles 81 (i.e., a distance between the centers of adjacent nozzles 81) in the alignment direction J is equal to an alignment pitch of the effective pixels $P_E$ (i.e., a distance between the centers of adjacent effective pixels $P_E$) in the X direction, the alignment direction J is set to coincide with the alignment direction X of the effective pixels $P_E$. The droplet discharge head 20 is configured to be rotatable within an angle θ on a plane parallel to the effective optical area $T_E$, and the alignment direction J of the nozzles 81 is controlled so that the alignment pitch of the nozzles 81 in the X direction (i.e., an alignment pitch of the nozzles 81 projected on an X axis) coincides with the alignment pitch of the effective pixels $P_E$ in the X direction. In a situation where the alignment direction J has been settled in such a manner, the droplet discharge head 20 and the base substrate P are capable of relative movement in the X and Y directions.

Figure 2:
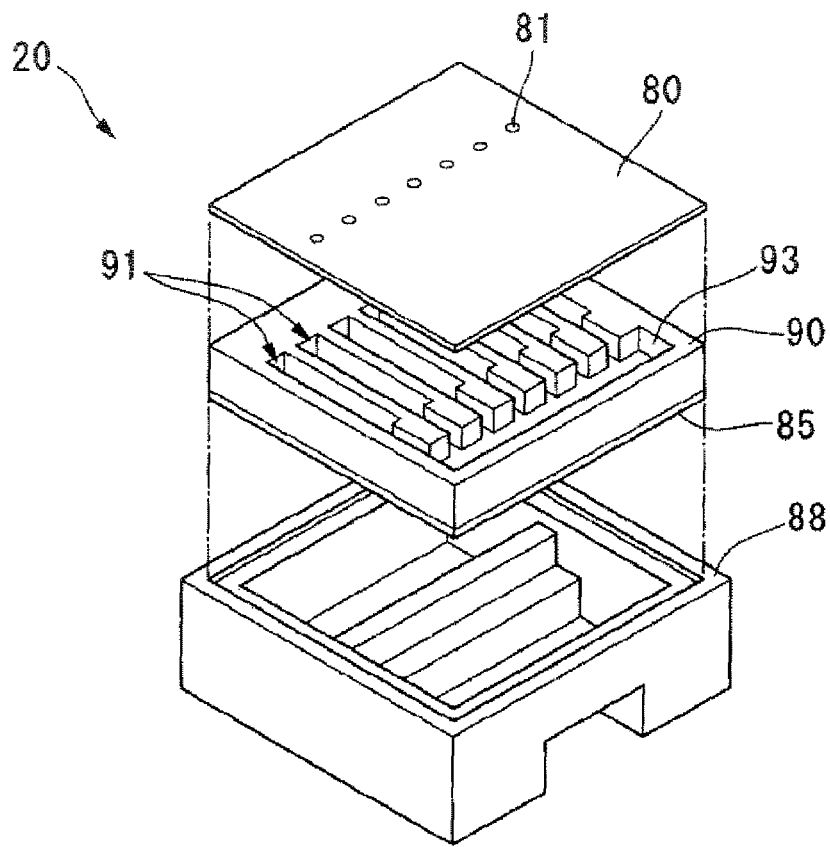
FIG. 2 is an exploded perspective view of a droplet discharge head, which is an exemplary means of arranging a functional fluid.

FIG. 2 is an exploded perspective view of an example of the droplet discharge head 20.

The droplet discharge head 20 includes a nozzle plate 80 having the plurality of nozzles 81, a pressure chamber substrate 90 having a vibrating plate 85, and a housing 88 for supporting the nozzle plate 80 and the vibrating plate 85 by putting them inside it.

Figure 3:
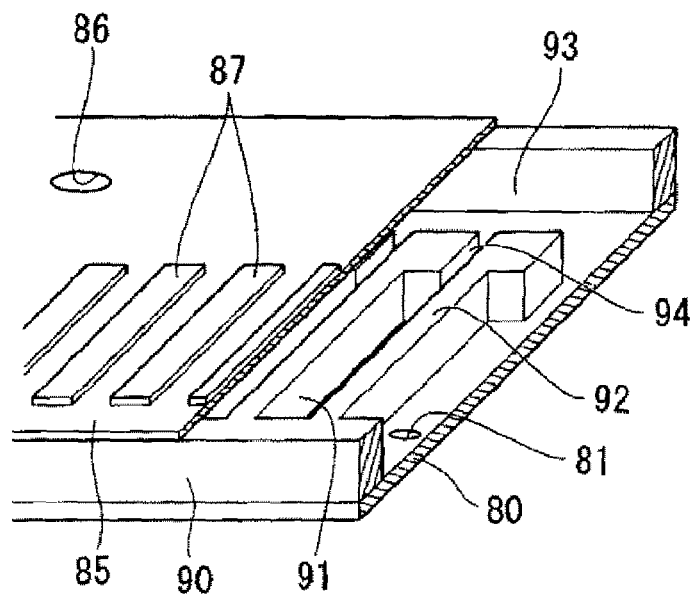
FIG. 3 is a partial perspective view of the droplet discharge head illustrating a principal part thereof.

The structure of a principal part of the droplet discharge head 20 is, as illustrated in a partial perspective view of FIG. 3, a structure in which the pressure chamber substrate 90 is sandwiched between the nozzle plate 80 and the vibrating plate 85. Each of the nozzles 81 of the nozzle plate 80 corresponds to a separate pressure chamber (i.e., a cavity) 91 formed and defined in the pressure chamber substrate 90. In the pressure chamber substrate 90, the plurality of cavities 91 are formed so as to be each capable of functioning as a pressure chamber by etching a silicon single-crystal substrate or the like. The cavities 91 are separated by side walls 92. Each of the cavities 91 is connected via a supply opening 94 to a reservoir 93, which is a common channel.

The vibrating plate 85 is provided with a tank hole 86, which makes it possible to supply an arbitrary liquid material from a liquid material supply tank (not shown) via a pipe. A piezoelectric element 87 is disposed at a position, on the vibrating plate 85, corresponding to each cavity 91. The piezoelectric element 87 has a structure in which a crystal of piezoelectric ceramics such as a PZT element or the like is sandwiched between an upper electrode and a lower electrode (not shown). The piezoelectric element 87 is configured to be capable of varying in volume in response to a discharge signal supplied from a control device (not shown).

In order to discharge a droplet from the droplet discharge head 20, the control device first supplies to the droplet discharge head 20 the discharge signal for causing the discharge of the droplet. The droplet has been flowed into the cavity 91 of the droplet discharge head 20, and in the droplet discharge head 20, to which the discharge signal has been supplied, the piezoelectric element 87 varies in volume as a result of a voltage applied between the upper and lower electrodes thereof. This variation in volume deforms the vibrating plate 85, resulting in variation in volume of the corresponding cavity 91. As a result, the droplet is discharged from the nozzle 81 of the cavity 91. Thereafter, the liquid material is resupplied from the liquid material supply tank to the cavity 91, from which the droplet has been discharged.

Note that the droplet discharge head 20 provided in the droplet discharge device IJ according to the present embodiment discharges the droplets by causing the piezoelectric elements to vary in volume. However, the droplets may be discharged by applying heat to the liquid material using a heating element and thereby expanding the liquid material.

Figure 4A:
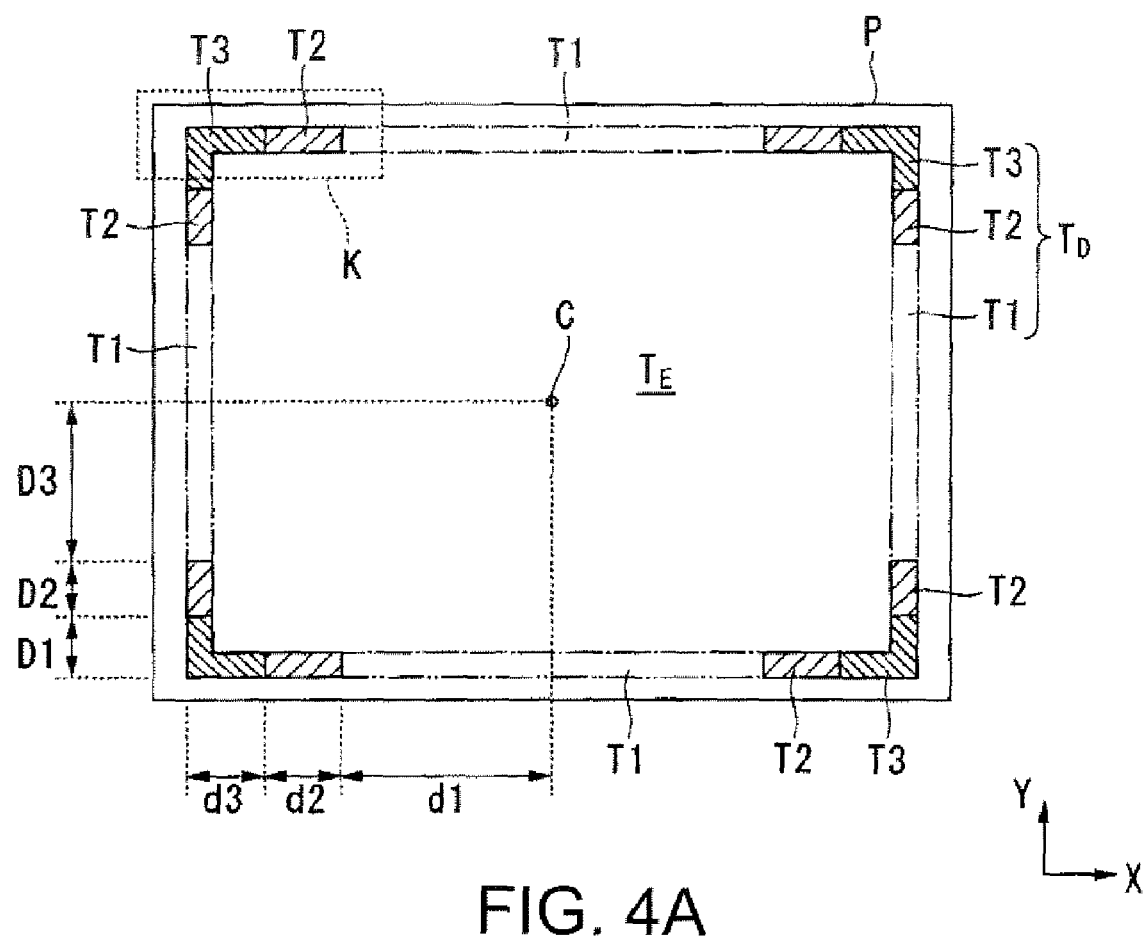
FIGS. 4A and 4B are plan views of a base substrate including a dummy area.
Figure 4B:
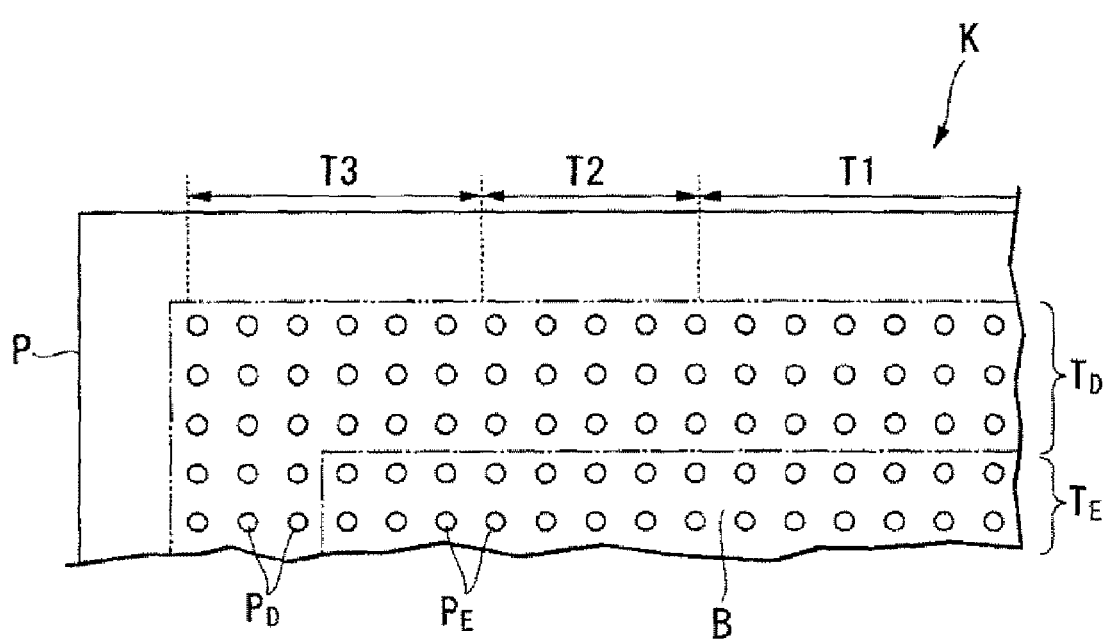

FIGS. 4A and 4B are schematic diagrams illustrating a structure in plan view of the base substrate P including the effective optical area $T_E$. More specifically, FIG. 4A is a schematic diagram illustrating the structure of the effective optical area $T_E$ and an area surrounding the effective optical area $T_E$, and FIG. 4B is an enlarged schematic view of portion K of those areas, i.e., an area at a corner of the effective optical area $T_E$.

As illustrated in FIGS. 4A and 4B, in the method for forming a film pattern according to this embodiment of the invention, a dummy area $T_D$, which is a non-effective area, is provided around the effective optical area (i.e., the effective area) $T_E$, and a dummy liquid material is discharged onto the dummy area $T_D$, so that the surrounding area of the effective optical area $T_E$ is also provided with the same solvent atmosphere as the effective optical area $T_E$. As the dummy liquid material, a functional fluid which is the same liquid material as that discharged onto the effective optical area is typically employed. Alternatively, another liquid material containing the same solvent as that contained in the aforementioned functional fluid or a liquid material consisting only of that solvent may be employed.

The dummy area $T_D$ is provided so as to enclose the effective optical area $T_E$ and has the same pixel structure as that of the effective optical area $T_E$. Pixels $P_D$ formed in the dummy area $T_D$ are called dummy pixels as opposed to the effective pixels $P_E$ formed in the effective optical area $T_E$. The dummy pixels $P_D$ are pixels that do not contribute to display, and neither a pixel electrode nor a switching element is typically formed in the dummy pixel. However, the dummy pixel is sometimes provided with the pixel electrode and the switching element mostly for testing.

Figure 5A:
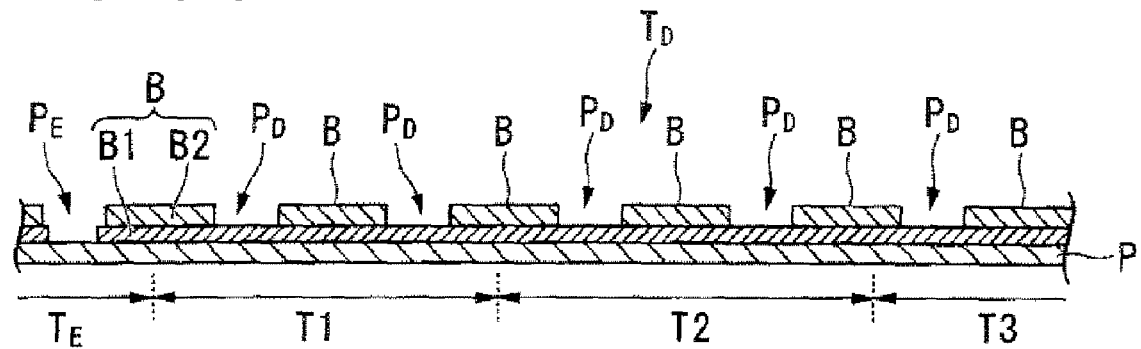
FIGS. 5A to 5C are process drawings illustrating an exemplary procedure for forming the film pattern.
Figure 5B:
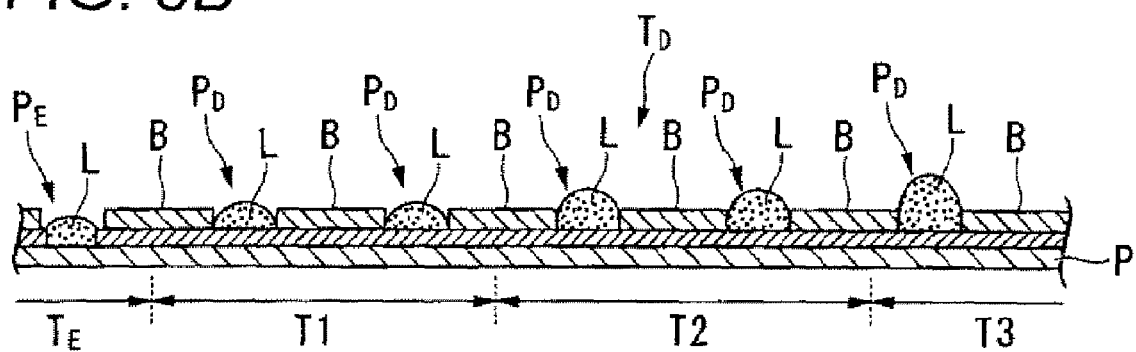
Figure 5C:
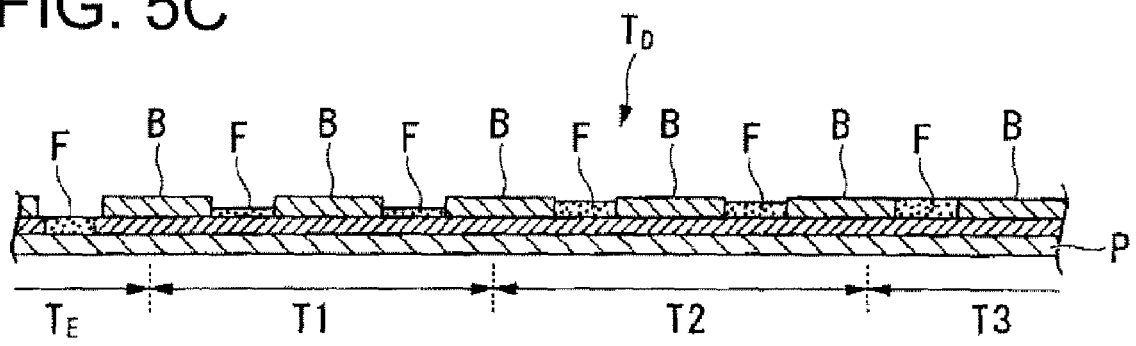

In the droplet discharge method, partitions (i.e., banks) B for separating the pixels are generally formed between the pixels in order to arrange the discharged droplets on predetermined pixels with high precision (see FIGS. 5A to 5C). Because the partitions B define the form of a film pattern, finer or thinner film patterns are aimed at by forming the partitions B appropriately, such as making the interval between adjacent partitions B shorter, for example. In particular, in the case where surfaces of the partitions B are treated so that they become liquid-repellent, it becomes possible to arrange the droplets only in openings of the partitions B accurately. In FIG. 4B, individual areas defined by the partitions B are liquid reception portions according to this embodiment of the invention, and of these liquid reception portions, liquid reception portions arranged in the effective optical area $T_E$ become the effective pixels $P_E$ and liquid reception portions arranged in the dummy area $T_D$ become the dummy pixels $P_D$.

Note that without the formation of the partitions B, areas where the functional fluids are arranged and areas where the functional fluids are not arranged may be defined by only treating a surface of the base substrate P. Specifically, specific areas on the surface of the base substrate P may be subjected to a treatment (i.e., a liquid-repellency imparting treatment) for allowing those specific areas to have reduced affinity for the functional fluid (i.e., reduced affinity for liquid), so that the areas where the effective pixels $P_E$ and the dummy pixels $P_D$ are formed become areas (i.e., high liquid affinity areas) that have relatively high affinity for the functional fluid while the remaining area becomes an area (i.e., a liquid-repellent area) that has relatively low affinity for the functional fluid. In this case, without the formation of the partitions B, it is possible to arrange the functional fluid only in the effective pixels $P_E$ and the dummy pixels $P_D$, which are high liquid affinity areas. In this embodiment of the invention, the concept of the liquid reception portions embraces such high liquid affinity areas.

In FIG. 4B, the shape (i.e., the shape of the openings of the partitions B), size (i.e., an area of each of the openings of the partitions B), and alignment pitch (i.e., the distance between the centers of adjacent dummy pixels $P_D$) of the dummy pixels $P_D$ are identical to the shape, size, and alignment pitch of the effective pixels $P_E$, respectively. In other words, a partition structure in the effective optical area $T_E$ also spreads over the surrounding area of the effective optical area $T_E$. This embodiment of the invention is not different from related art in this respect but different in that, in the dummy area $T_D$, larger amounts of the dummy solvent are discharged in areas that are more distant from the center C of the effective optical area $T_E$. For example, the amount of the solvent discharged onto the dummy pixels $P_D$ is divided into three levels depending on the distance from the center C, and in an area T1, which is located at a central portion of each side edge of the effective optical area $T_E$ and the closest to the center C, the smallest amount of the solvent is discharged; in an area T3, which is located at each corner of the effective optical area $T_E$ and the most distant from the center C, the largest amount of the solvent is discharged; and in an area T2, which is intermediate between those two areas, an intermediate amount of the solvent is discharged. The discharge amount onto the dummy pixels $P_D$ in the area T1, where the smallest amount of the solvent is discharged, is equal to the discharge amount onto the effective pixels $P_E$ in the effective optical area $T_E$.

Because the drying of the functional fluids discharged onto the base substrate P progresses from the periphery toward the center of the effective optical area $T_E$ concentrically, the drying of the solvent may progress at a higher rate at the corner portions T3 of the rectangular effective optical area $T_E$ and their neighborhoods T2 than at other portions. Accordingly, simply providing the dummy area $T_D$ as in related art sometimes fails to prevent the unevenness in film thickness to a sufficient extent. In this embodiment of the invention, however, because larger amounts of the dummy solvent are discharged onto the dummy pixels $P_D$ in areas that are more distant from the center C of the effective optical area $T_E$, even in the corner portions of the effective optical area $T_E$, where drying progresses rapidly, the partial pressure of solvent molecules is not reduced abruptly. Thus, it is possible to equalize the partial pressure of the solvent molecules (which are evaporated) throughout the entire effective optical area. That is, in relate art techniques, since the same amount of the solvent is simply arranged onto all dummy pixels $P_D$, which are formed to have the same pitch and size, the solvent is dried too rapidly in the corner portions of the effective optical area $T_E$, which are the most distant from the center C. In contrast, in this embodiment of the invention, because the amount of the solvent is increased in the areas at the corner portions of the effective optical area $T_E$, where drying progresses rapidly and the partial pressure of the solvent molecules is inclined to be reduced abruptly, variations do not occur in the duration period of the solvent within the effective optical area $T_E$. Thus, the drying rate becomes equalized throughout the entire effective optical area, resulting in formation of high-quality films without unevenness in film thickness or film inclination.

The proportion of each of the areas T1 to T3 to the dummy area $T_D$ and the amount of the solvent discharged onto each dummy pixel $P_D$ in each of the areas T1 to T3 are determined based on the drying rate of the functional fluid in each of the areas T1 to T3. For example, the drying time of the functional fluid is measured with respect to a central portion of the effective optical area $T_E$, the central portion of the side edge of the effective optical area $T_E$, and the corner portion of the effective optical area $T_E$, and the discharge amounts onto the dummy pixels $P_D$ are determined so as to be different between the areas T1 to T3 so that the difference in the drying time between those areas becomes sufficiently small. In this case, because the drying time is affected by the type of the solvent used, the viscosity of the functional fluid, and the like, these factors should be considered sufficiently when determining the discharge amount for each of the areas T1 to T3.

Next, with reference to FIGS. 5A to 5C, the method for forming a film pattern according to this embodiment of the invention will now be described below.

First, as illustrated in FIG. 5A, the partitions B are formed in the effective optical area $T_E$ and the dummy area $T_D$ (T1, T2, and T3) of the base substrate P.

For the base substrate P, various substances may be employed, such as glass, quartz glass, a Si wafer, a plastic film, a metal plate, etc. In addition, a semiconductor film, a metal film, a dielectric film, an organic film, or the like may be formed as a foundation layer on a surface of the substrate of such substances.

The formation of the partitions B can be achieved by an arbitrary method, such as photolithography, printing, or the like. For example, single-layer partitions can be formed by first spreading a material of the partitions throughout the base substrate P by spin coating or the like and then patterning it by photolithography. As illustrated in FIG. 5A, the partitions B may be formed of two or more layers, such as an inorganic lower layer B1 and an organic upper layer B2. In this case, the lower layer B1 at the dummy pixels $P_D$ may be subjected to patterning, or alternatively, as illustrated in FIG. 5A, the patterning of the lower layer B1 may not be performed at the dummy pixels $P_D$. In the case where the patterning is not performed, areas defined by the upper layer B2 become the dummy pixels $P_D$. Any material can be employed as the material of the partitions B as long as it is excellent in thermal resistance, liquid repellency, solvent resistance, and adhesion to the foundation substrate.

The partitions B may be subjected to the liquid-repellency imparting treatment or a liquid-affinity imparting treatment as necessary.

As the liquid-affinity imparting treatment, a plasma treatment using oxygen for a treatment gas (i.e., an $O_2$ plasma treatment or the like), ultraviolet irradiation in an atmosphere of oxygen, or the like may be employed.

As the liquid-repellency imparting treatment, a plasma treatment using gas (i.e., fluorine-containing gas) containing a fluorine component, such as $CF_4$, $SF_6$, $CHF_3$, or the like, may be employed. Instead of performing the liquid-repellency imparting treatment, a liquid-repellent component such as a fluorine radical or the like may be previously filled into the material of the partitions B (e.g., the material for forming the organic layer B2). By making the surfaces of the partitions B liquid-repellent, it becomes possible to form the films only in the openings of the partitions B while preventing unnecessary films from being formed on the top surfaces of the partitions B.

After the partitions B are formed, functional fluids L are discharged onto the areas $P_E$ and $P_D$ defined by the partitions B as illustrated in FIG. 5B. The functional fluid L is a liquid material in which a material for forming a film pattern F is dissolved or dispersed in the solvent.

As the material for forming the film pattern F, a material (i.e., a high-performance material) that has various functions, such as an electrical function, an optical function, or the like, can be employed. In the case of forming a luminescent layer of an organic EL element, for example, a material that has fluorescence or phosphorescence may be employed as the high-performance material. In the case of forming a color filter, a fine-particle coloring material such as a pigment may be employed. In the case of forming a transparent pixel electrode for a liquid crystal device or the like, a fine-particle conductive material such as an indium tin oxide (ITO) may be employed.

For the solvent, any substance may be employed as long as it is capable of dissolving or dispersing the aforementioned high-performance material and does not cohere. For example, water, alcohol, hydrocarbon compounds, and ether compounds are preferable for the solvent.

For the discharge of the functional fluids L, the above-described droplet discharge device IJ is employed.

Larger amounts of the solvent are discharged onto the dummy pixels $P_D$ in areas that are more distant from the center C of the effective optical area $T_E$. The reason for this is that, because the droplets in areas that are more distant from the center C dry in shorter times, if the same amount of the solvent is discharged onto all dummy pixels $P_D$, unevenness in drying time may occur at the corner portions of the effective optical area $T_E$ or the like, resulting in failure of uniform drying. In contrast, in the case where the amounts of the solvent to be discharged are adjusted depending on the distance from the center C of the effective optical area $T_E$ as in this embodiment of the invention, unevenness in duration period of the solvent does not occur within the effective optical area $T_E$, making it possible to form, throughout the effective optical area, high-quality films without unevenness in film thickness or film inclination. The amounts of the solvent to be discharged can be adjusted by varying the number of droplet shots, the proportion of the solvent within the liquid material to be discharged, or the like.

In the method for forming a film pattern according to this embodiment of the invention, the amounts of the droplets discharged onto the dummy pixels $P_D$ vary with location. However, in the case where the alignment pitch of the dummy pixels $P_D$ is identical to the alignment pitch of the effective pixels $P_E$ as in FIGS. 4A and 4B, the discharge of the droplets using the droplet discharge head 20 can be performed on both the effective optical area $T_E$ and the dummy area $T_D$ with the alignment direction J of the nozzles 81 (i.e., the angle θ in FIG. 1) fixed.

After the functional fluids L are discharged, the solvent of each functional fluid L is removed by drying as illustrated in FIG. 5C, whereby the film pattern F made of the aforementioned high-performance material is formed in the effective pixel $P_E$.

As described above, in this embodiment of the invention, the dummy liquid material is discharged onto the surrounding area of the effective optical area $T_E$; therefore, when the functional fluids L are dried, the partial pressure of the solvent molecules (which are evaporated) in the effective optical area $T_E$ does not become excessively higher as compared to the partial pressure of the solvent molecules (which are evaporated) in the dummy area $T_D$. In particular, because the amounts per unit area of the solvent arranged in the dummy area $T_D$ are larger in areas that are more distant from the center C of the effective optical area $T_E$, the partial pressure of the solvent molecules (which are evaporated) and the duration period of the solvent in the effective optical area $T_E$ are substantially the same in the central and peripheral portions of the effective optical area $T_E$. As a result, the film thickness of the film patterns F becomes equalized throughout the effective optical area.

Exemplary Variants

Next, exemplary variants of the method for forming a film pattern according to the present embodiment of the invention will now be described.

Figure 6:
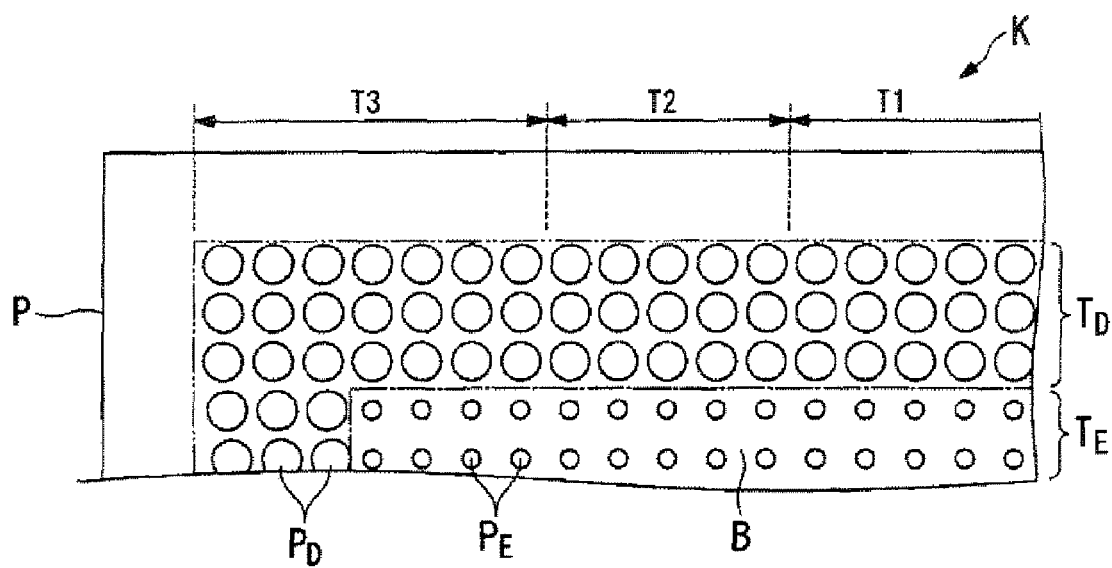
FIG. 6 is a plan diagram illustrating another configuration of dummy pixels.

FIG. 6 is a schematic diagram illustrating the structure of dummy pixels $P_D$ according to one exemplary variant in plan view. This figure corresponds to FIG. 4B of the first embodiment.

In FIG. 6, the size of the dummy pixels $P_D$ is larger than the size of effective pixels $P_E$. The shape and size of the dummy pixels $P_D$ are common to all of the area T1, the area T2, and the area T3. The only difference between these areas T1 to T3 is the amount of the solvent discharged onto the dummy pixels $P_D$. Note that the alignment pitches of the dummy pixels $P_D$ in the X and Y directions in each of the areas T1 to T3 are identical to the alignment pitches of the effective pixels $P_E$ in the X and Y directions in the effective optical area $T_E$.

Figure 7:
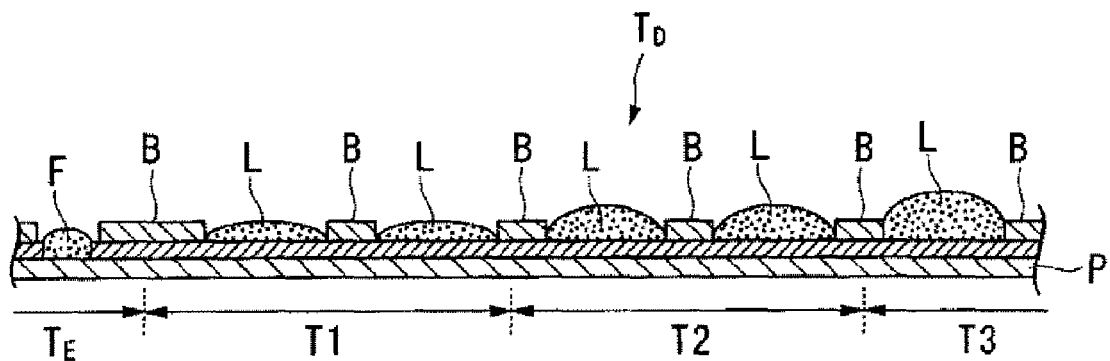
FIG. 7 is a cross-sectional diagram illustrating a state where the functional fluid has been arranged in the dummy pixels.

FIG. 7 is a diagram illustrating a state where the functional fluids L have been discharged onto the effective pixels $P_E$ and the dummy pixels $P_D$. The amount of the functional fluid L (especially, of the solvent therein) discharged onto the dummy pixels $P_D$ is divided into three levels depending on the distance from the center C of the effective optical area $T_E$, and in the area T1, which is located at the central portion of a side edge of the effective optical area $T_E$ and the closest to the center C, the discharge amount is the smallest; in the area T3, which is located at a corner of the effective optical area $T_E$ and the most distant from the center C, the discharge amount is the largest; and in the area T2, which is intermediate between those two areas, the discharge amount is intermediate.

In the case where the size of the dummy pixels $P_D$ is identical to the size of the effective pixels as in the first embodiment, overflow of the functional fluids L may occur in the dummy pixels $P_D$ far from the center C of the effective optical area $T_E$, especially in the dummy pixels $P_D$ arranged at the corner portions of the effective optical area $T_E$. In this exemplary variant, however, such a problem does not occur even in such dummy pixels, and a sufficient amount of the functional fluids L can be discharged onto such dummy pixels.

Figure 8:
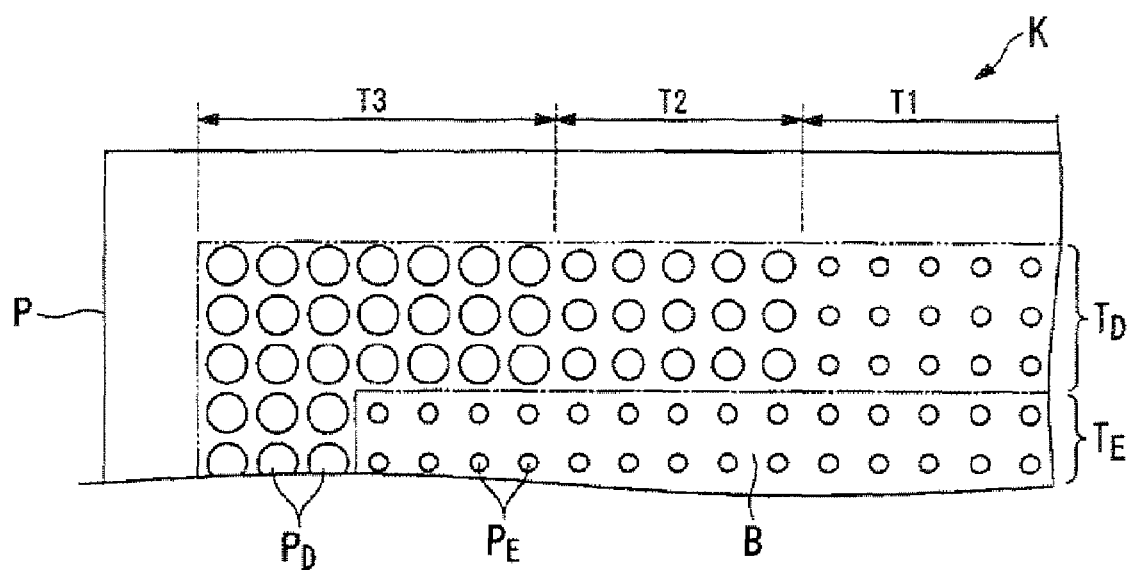
FIG. 8 is a plan diagram illustrating yet another configuration of the dummy pixels.

FIG. 8 is a schematic diagram illustrating another structure of the dummy pixels $P_D$.

In FIG. 8, the size of the dummy pixels $P_D$ becomes larger as the area in which they are located is more distant from the center C of the effective optical area $T_E$. For example, the size of the dummy pixels $P_D$ is divided into three levels depending on the distance from the center C, and in the area T1, which is located at the central portion of a side edge of the effective optical area $T_E$ and the closest to the center C, the size is the smallest; in the area T3, which is located at a corner of the effective optical area $T_E$ and the most distant from the center C, the size is the largest; and in the area T2, which is intermediate between those two areas, the size is intermediate. The size of the dummy pixels $P_D$ in the area T1 (i.e., the smallest size) is equal to the size of the effective pixels $P_E$ in the effective optical area $T_E$. Note that the alignment pitches of the dummy pixels $P_D$ in the X and Y directions in each of the areas T1 to T3 are identical to the alignment pitches of the effective pixels $P_E$ in the X and Y directions in the effective optical area $T_E$.

Figure 9:
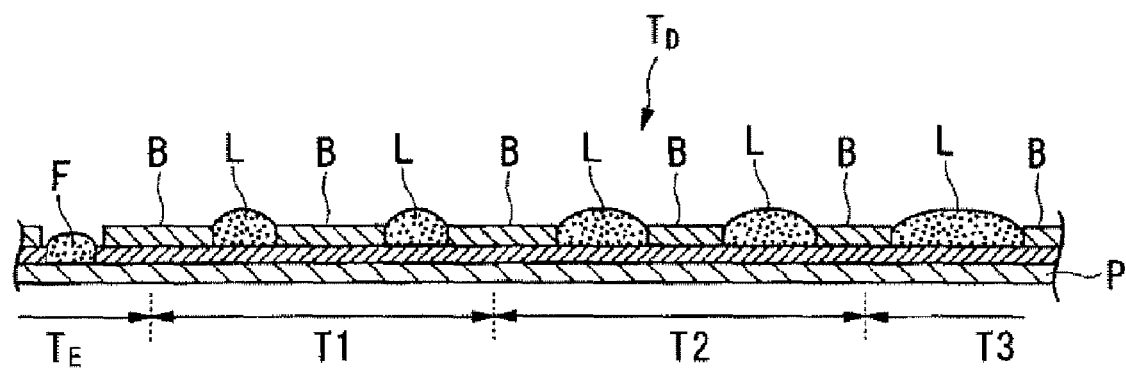
FIG. 9 is a cross-sectional diagram illustrating a state where the functional fluid has been arranged in the dummy pixels.

FIG. 9 is a diagram illustrating a state where the functional fluids L have been discharged onto the effective pixels $P_E$ and the dummy pixels $P_D$. The amount of the functional fluid L (especially, of the solvent therein) discharged onto the dummy pixels $P_D$ is divided into three levels depending on the distance from the center C of the effective optical area $T_E$, and in the area T1, which is located at the central portion of the side edge of the effective optical area $T_E$ and the closest to the center C, the discharge amount is the smallest; in the area T3, which is located at the corner of the effective optical area $T_E$ and the most distant from the center C, the discharge amount is the largest; and in the area T2, which is intermediate between those two areas, the discharge amount is intermediate.

According to this structure, because the dummy pixels $P_D$ onto which larger amounts of the functional fluid L are discharged (i.e., the dummy pixels $P_D$ that are more distant from the center C of the effective optical area $T_E$) have larger sizes, it is possible to prevent a problem such as the overflow of the functional fluid L or the like from occurring in those dummy pixels $P_D$, which are far from the center C. In addition, since the functional fluid L arranged in each of the dummy pixels $P_D$ spreads to have the size of the dummy pixel $P_D$ as a result of flowing, the solvent achieves a greater surface area in the area T3, which is located at the corner portion of the effective optical area $T_E$ and where drying progresses rapidly and the partial pressure of the solvent molecules is inclined to be reduced abruptly. The partial pressure of the solvent molecules depends on the surface area of the discharged solvent, and the greater the surface area is, the higher the partial pressure of the solvent molecules (which are evaporated) becomes. In this exemplary variant, since the surface area of the solvent is adjusted by varying the size of the dummy pixels $P_D$ and the amount of the solvent to prevent variations in the partial pressure of the solvent molecules within the effective optical area $T_E$, it is possible to form films with greater uniformity.

Second Embodiment

Next, as one embodiment of a method for manufacturing a device according to one embodiment of the invention, an exemplary method for manufacturing an organic EL device to which a method for forming a film pattern according to one embodiment of the invention is applied will now be described. This organic EL device is an organic EL device in which organic EL elements are arranged as pixels on a base substrate, and can be used suitably, for example, as a display in an electronic device or the like.

Figure 10:
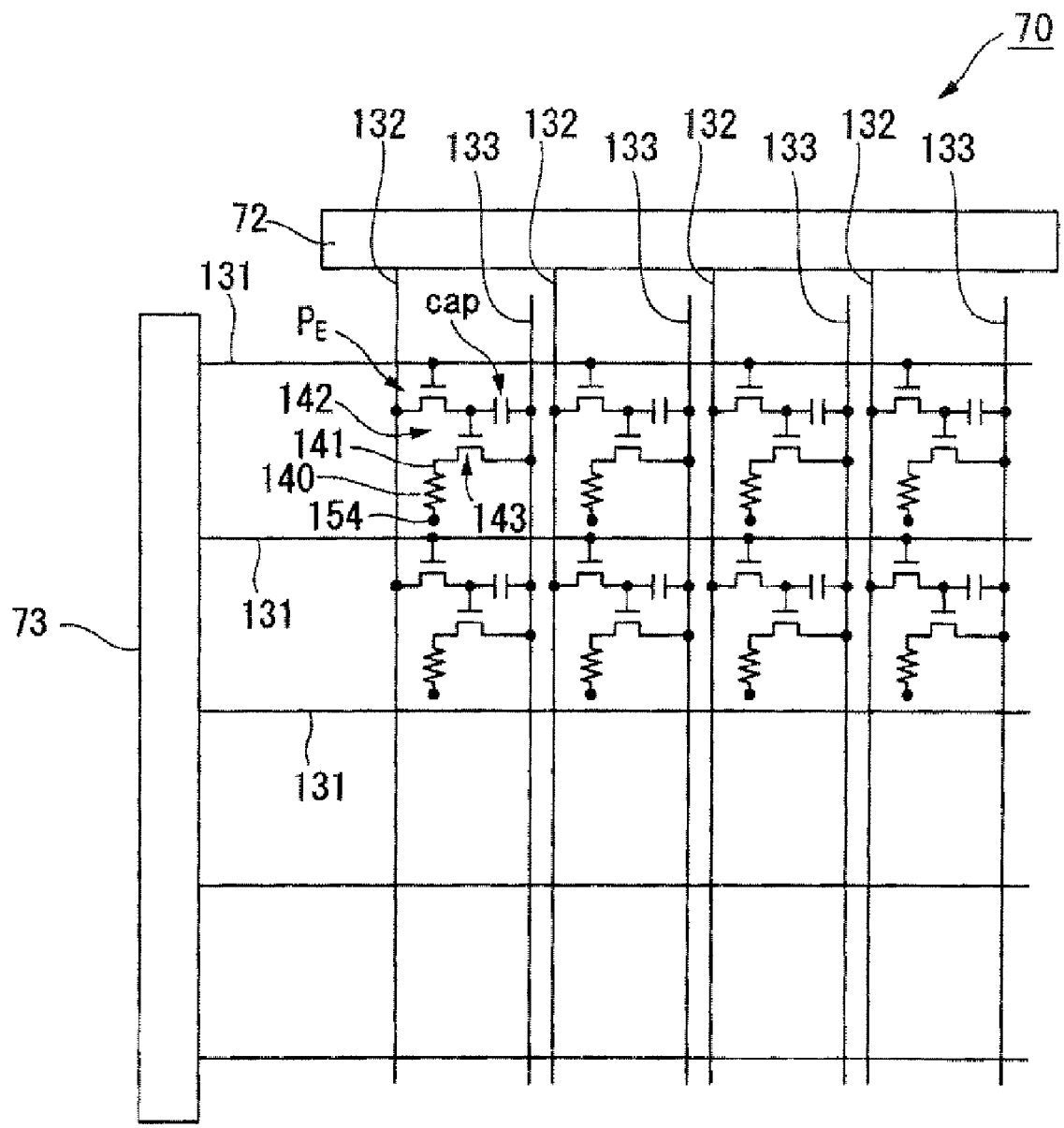
FIG. 10 is an equivalent circuit diagram of an organic EL device, which is an exemplary device according to one embodiment of the invention.
Figure 11:
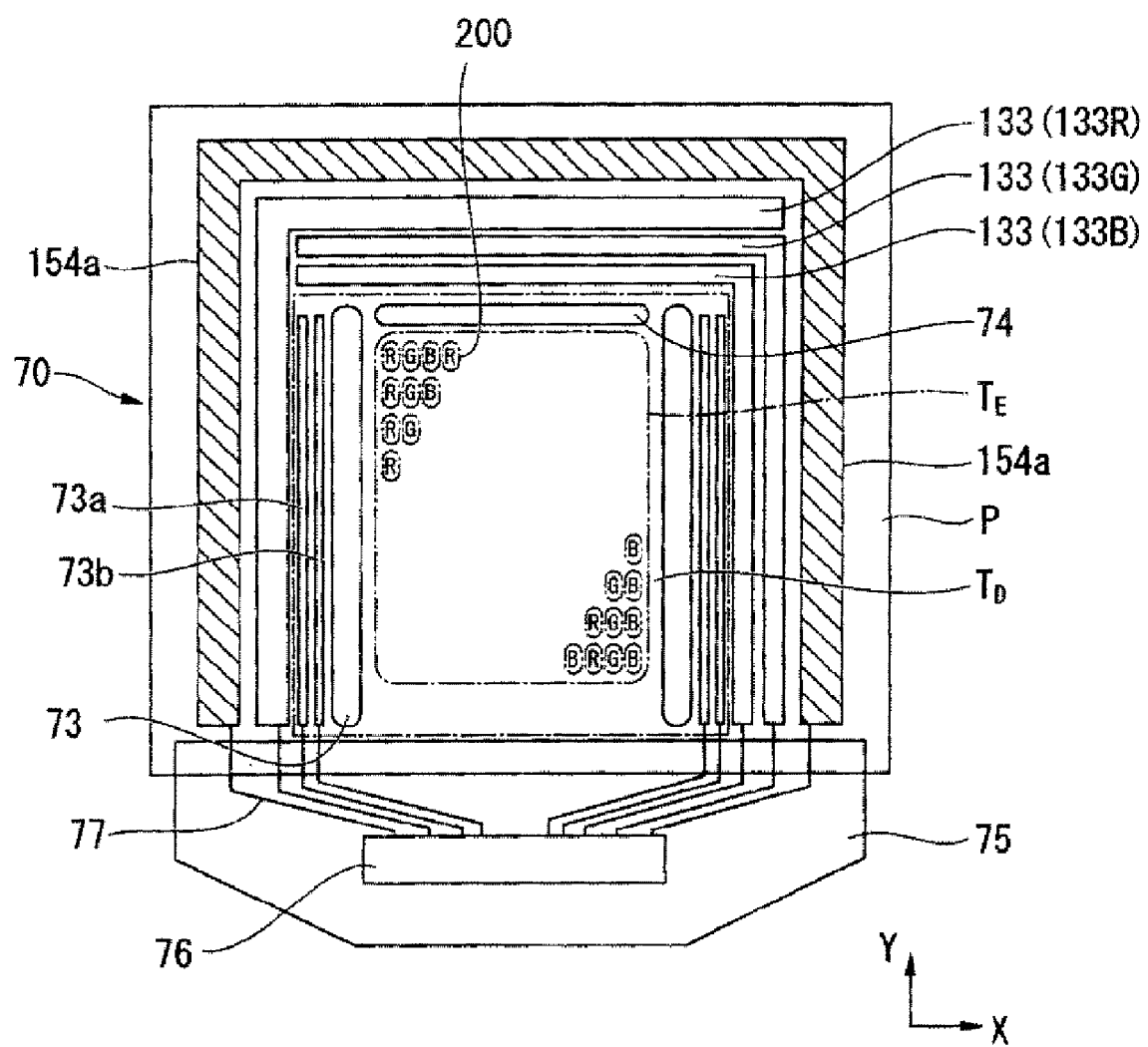
FIG. 11 is a plan diagram illustrating an overall structure of the organic EL device.
Figures 12A, 12B:
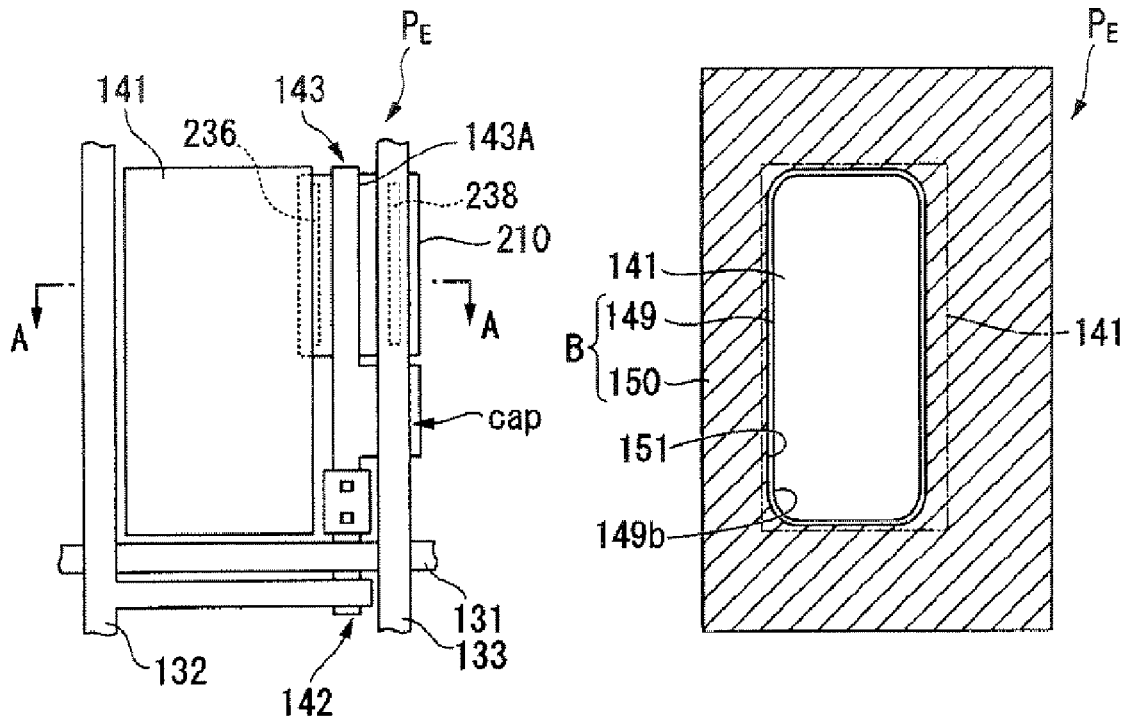
FIGS. 12A and 12B are plan diagrams illustrating a structure of one pixel of the organic EL device.
Figure 13:
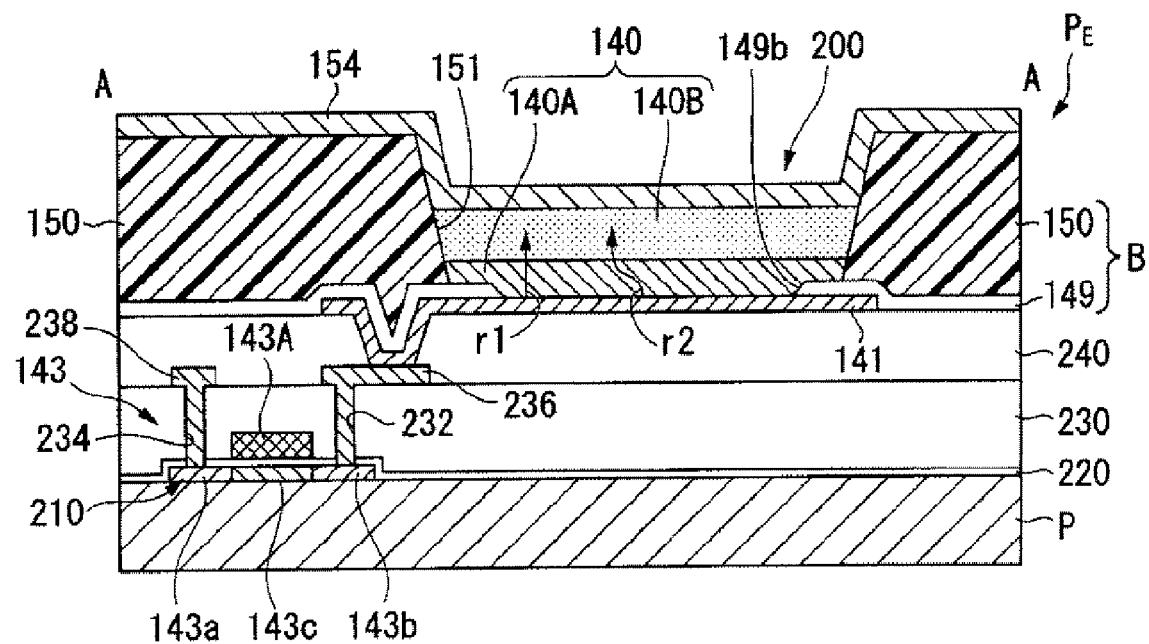
FIG. 13 is a cross-sectional diagram taken along line A-A of FIG. 12A.

FIG. 10 is a diagram illustrating the circuit structure of an organic EL device 70, and FIG. 11 is a schematic plan view of the organic EL device 70. FIGS. 12A and 12B are diagrams illustrating the structure of each pixel $P_E$ provided in the organic EL device 70 in plan view. More specifically, FIG. 12A primarily illustrates a pixel driving portion, such as a TFT or the like, of the pixel $P_E$, and FIG. 12B illustrates the bank (i.e., the partition) B that separates the pixels and the like. FIG. 13 is a diagram illustrating a cross-sectional structure taken along line A-A of FIG. 12A.

As illustrated in FIG. 10, in the organic EL device 70, a plurality of scan lines (i.e., wires, a power conducting portion) 131, a plurality of signal lines (i.e., wires, a power conducting portion) 132 extending in such a direction as to intersect with the scan lines 131, and a plurality of common power supply lines (i.e., wires, a power conducting portion) 133 extending in parallel with the signal lines 132 are arranged on the base substrate made of glass or the like. In addition, the pixel $P_E$ is provided for each of the intersections of the scan lines 131 and the signal lines 132.

For the signal lines 132, a data-side driving circuit 72 equipped with a shift register, a level shifter, a video line, an analog switch, and the like is provided. For the scan lines 131, a scanning-side driving circuit 73 equipped with a shift register, a level shifter, and the like is provided. Each of the pixels $P_E$ is provided with: a thin-film transistor (TFT) 142 for switching use, in which a scanning signal is supplied to a gate electrode via a corresponding one of the scan lines 131; a storage capacitor cap that holds an image signal (i.e., power) supplied from a corresponding one of the signal lines 132 via the thin-film transistor (TFT) 142 for switching use; a TFT 143 for driving use, in which the image signal held by the storage capacitor cap is supplied to a gate electrode; a pixel electrode 141, to which a driving current flows from a corresponding one of the common power supply lines 133 when the pixel electrode 141 is electrically connected to the corresponding common power supply line 133 via the TFT 143 for driving use; and a luminescent portion 140 sandwiched between the pixel electrode 141 and a common electrode 154. An element constructed of the pixel electrode (i.e., a first electrode) 141, the common electrode (i.e., a second electrode) 154, and the luminescent portion 140 formed by an organic functional layer is the organic EL element.

As such, if the scan line 131 is driven to turn on the TFT 142 for switching use, an electric potential of the signal line 132 at the time is held by the storage capacitor cap, and the on/off state of the TFT 143 for driving use is determined depending on the state of the storage capacitor cap. Then, a current flows from the common power supply line 133 to the pixel electrode 141 via a channel of the TFT 143 for driving uses and the current flows to the common electrode 154 via the luminescent portion 140. As a result, the luminescent portion 140 emits light in accordance with the amount of the current that flows therethrough.

Next, as illustrated in FIG. 11, in plan view, the organic EL device 70 according to this embodiment has organic EL elements 200 arranged in a matrix on a central portion of the base substrate P.

The base substrate P is a transparent substrate made of glass, for example. The base substrate P is divided into the effective optical area (i.e., the effective area) $T_E$, which is located at the central portion of the base substrate P and where the organic EL elements 200 function, and the dummy area (i.e., the non-effective area) $T_D$, which is located at the peripheral portion of the base substrate P and surrounds the effective optical area $T_E$ and where the organic EL elements 200 do not function. The effective optical area $T_E$ is an area formed by the organic EL elements 200 arranged in a matrix and is also called an effective display area. The dummy area $T_D$ is provided adjacent to the effective optical area $T_E$ and is an area that does not contribute to display. In the effective optical area $T_E$ and the dummy area $T_D$, the banks B (see FIGS. 12A and 12B) that define the effective pixels and the dummy pixels, respectively, are formed. Areas defined by the banks B constitute the liquid reception portions where the functional fluids are arranged, and the organic functional layer of the organic EL element, which will be described later, is formed by arranging the functional fluid in the liquid reception portion. That is, the areas defined by the banks B are the pixels, and in the effective optical area $T_E$, the organic EL element 200 is formed in each pixel.

The common electrode 154 has one end connected to a wire for a cathode (not shown) formed on the base substrate P, and as illustrated in FIG. 11, one end 154a of this wire is connected to a wire 77 on a flexible substrate 75. This wire 77 is connected to a drive IC (i.e., a drive circuit) 76 provided on the flexible substrate 75.

In addition, as illustrated in FIG. 11, in the dummy area $T_D$ of the base substrate P, the aforementioned common power supply lines 133 (133R, 133G, and 133B) are arranged. Further, in FIG. 11, the aforementioned scanning-side driving circuits 73 are arranged on both sides of the effective optical area $T_E$. These scanning-side driving circuits 73 are provided on a circuit element portion below the dummy area $T_D$. Further, a control signal wire 73a for a drive circuit and a power source wire 73b for a drive circuit, which are connected to the scanning-side driving circuits 73, are provided on the circuit element portion. In addition, in FIG. 11, a test circuit 74 is arranged on the upper side of the effective optical area $T_E$. Using this test circuit 74, it is possible to test a display device for quality and defects during the course of production or at the time of shipment.

Next, referring to the structure of the pixel $P_E$ in plan view as illustrated in FIG. 12A, the pixel $P_E$ has a structure in which the pixel electrode 141, which is substantially rectangular in plan view, is enclosed by the signal line 132, the common power supply line 133, the scan line 131, and the scan line (not shown) for another pixel electrode. Referring to the cross-sectional structure of the pixel $P_E$ illustrated in FIG. 13, the TFT 143 for driving use is provided on the base substrate P, and the organic EL element 200 is formed above the base substrate P with a plurality of insulating films that are formed to cover the TFT 143 for driving use between the TFT 143 and the organic EL element 200. A primary component of the organic EL element 200 is an organic functional layer 140 provided within the area enclosed by the banks B arranged above the base substrate P. The organic EL element 200 has a structure in which this organic functional layer 140 is sandwiched between the pixel electrode 141 and the common electrode 154.

Referring now to the structure of the pixel $P_E$ in plan view illustrated in FIG. 12B, the bank B has openings 149b and 151 which are substantially rectangular in plan view and correspond to the area where the pixel electrode 141 is formed. In these openings 149b and 151, the aforementioned organic functional layer 140 is formed.

As illustrated in FIG. 13, the TFT 143 for driving use is primarily constructed of a source region 143a, a drain region 143b, and a channel region 143c formed in a semiconductor film 210 and a gate electrode 143A, which is formed on a gate insulating film 220 formed on an upper surface of the semiconductor layer and is opposite to the channel region 143c. A first interlayer insulating film 230 is formed so as to cover the semiconductor film 210 and the gate insulating film 220, and contact holes 232 and 234 that penetrate the first interlayer insulating film 230 to reach the semiconductor film 210 are formed. A drain electrode 236 and a source electrode 238 are buried inside the contact holes 232 and 234, respectively, and electrically connected to the drain region 143b and the source region 143a, respectively. A second interlayer insulating film 240 is formed on the first interlayer insulating film 230, and a part of the pixel electrode 141 is buried within a contact hole that penetrates the second interlayer insulating film 240. Since the pixel electrode 141 and the drain electrode 236 are electrically connected to each other in such a manner, the TFT 143 for driving use and the pixel electrode 141 (i.e., the organic EL element 200) are electrically connected to each other. An inorganic bank (i.e., a first partition layer) 149 made of an inorganic insulating material is formed such that a part of the inorganic bank 149 extends over an edge portion of the pixel electrode 141. An organic bank (i.e., a second partition layer) 150 made of an organic material is formed on the inorganic bank 149. The inorganic bank 149 and the organic bank 150 constitute a partition member of the organic EL device 70.

The aforementioned organic EL element 200 is constructed by forming, on the pixel electrode 141, a hole injection layer 140A as a charge transport layer and a luminescent layer 140B layered one over the other, and forming the common electrode 154 so as to cover the luminescent layer 140B and the organic bank 150. The hole injection layer 140A is formed so as to cover the pixel electrode 141, and an edge portion of the hole injection layer 140A covers a portion of the inorganic bank 149, which is formed below the organic bank 150, that projects from the organic bank 150 toward the center of the pixel electrode 141.

In the case of a so-called bottom-emission type organic EL device, in which light is taken from the base substrate P side, a transparent substrate made of glass or the like is employed as the base substrate P. In the case of a so-called top-emission type organic EL device, in which light is taken from the organic EL element 200 side, not only a transparent substrate made of glass or the like but also an opaque substrate can be employed as the base substrate P. For the opaque substrate, a ceramic such as alumina or the like, a metal sheet made of stainless steel or the like that has been subjected to an insulating treatment such as surface oxidization or the like, thermosetting resin, thermoplastic resin, a film thereof (i.e., a plastic film), and the like may be employed.

In the case of the bottom-emission type organic EL device, in which light is taken through the base substrate P, the pixel electrode 141 is formed of a translucent conductive material such as indium tin oxide (ITO) or the like. In the case of the top-emission type organic EL device, the pixel electrode 141 may not necessarily be translucent but may be formed of any suitable conductive material such as metallic materials or the like.

The common electrode 154 is formed above the base substrate P so as to cover upper surfaces of the luminescent layer 140B and the bank B and a wall surface that forms a side surface portion of the bank B. In the case of the top-emission type organic EL device, a transparent conductive material is employed as a material for forming the common electrode 154. As such a transparent conductive material, ITO is preferable, but other translucent conductive materials may be employed instead. In the case of the bottom-emission type organic EL device, not only a transparent conductive material but also an opaque or light-reflective conductive material such as aluminum or the like may be employed.

A cathode protective layer may be formed on an upper surface of the common electrode 154. Provision of the cathode protective layer makes it possible to prevent the common electrode 154 from being corroded during the course of production. The cathode protective layer may be formed of an inorganic compound, e.g., a silicon compound such as silicon oxide, silicon nitride, silicon nitride oxide, or the like. By covering the common electrode 154 with the cathode protective layer made of such an inorganic compound, it becomes possible to satisfactorily prevent oxygen or the like from intruding into the common electrode 154 made of inorganic oxide. Such a cathode protective layer is formed so as to extend to a portion of the base substrate outside of a plane area of the common electrode 154 and have a thickness of approximately 10 nm to 300 nm.

Method for Manufacturing Organic EL Device

Next, a method for manufacturing the organic EL device 70 will now be described with reference to the drawings. In the present embodiment, by way of example, a method for manufacturing the organic EL device having the structure as illustrated in FIGS. 10 to 13 using the droplet discharge method will be described.

Note that a procedure and a combination of liquid materials as described below are only illustrative and not restrictive. As to the droplet discharge device, the above-described droplet discharge device can be used.

The method for manufacturing the organic EL element 200 provided in the above-described organic EL device 70 will now be described below with reference to FIGS. 14A to 14D and 15A to 15C. FIGS. 14A to 14D and 15A to 15C illustrate a boundary portion between the effective optical area $T_E$ and the dummy area $T_D$.

Figure 14A:
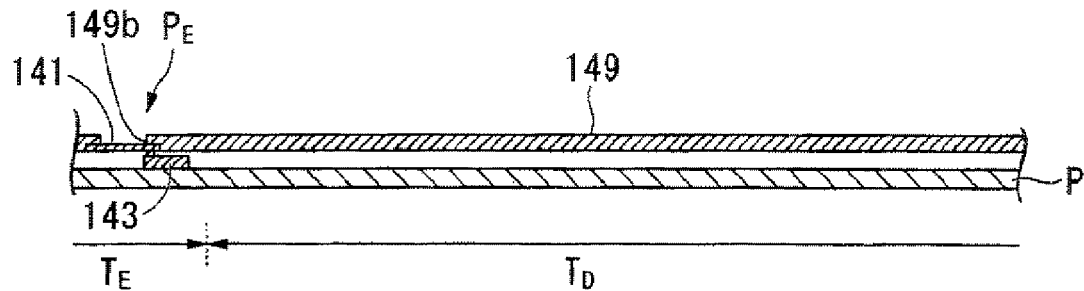
FIGS. 14A to 14D are process drawings illustrating an exemplary procedure for manufacturing the organic EL device.

First, as illustrated in FIG. 14A, the pixel electrode 141 and the TFT 143 for driving use, which is capable of driving the pixel electrode 141, are formed above the base substrate P. Although the pixel electrode 141 is formed only in the effective optical area $T_E$ in FIG. 14A, a similar pixel electrode may be formed in the dummy area $T_D$. In this case, the pixel (i.e., the dummy pixel) formed in the dummy area $T_D$ can be employed as an element for testing.

Next, the inorganic bank 149 made of an inorganic insulating material such as silicon oxide or the like is formed so as to partly overlie the edge portion of the pixel electrode 141 in plan view. More specifically, after a silicon oxide film is formed so as to cover the pixel electrode 141 and the planarization insulating film 240, the silicon oxide film is subjected to patterning using a known photolithography, so that the upper surface of the pixel electrode 141 is partly exposed. Although the patterning for the inorganic bank 149 is performed only in the effective optical area $T_E$ in FIG. 14A, a similar patterning may be performed in the dummy area $T_D$ as well.

Figure 14B:
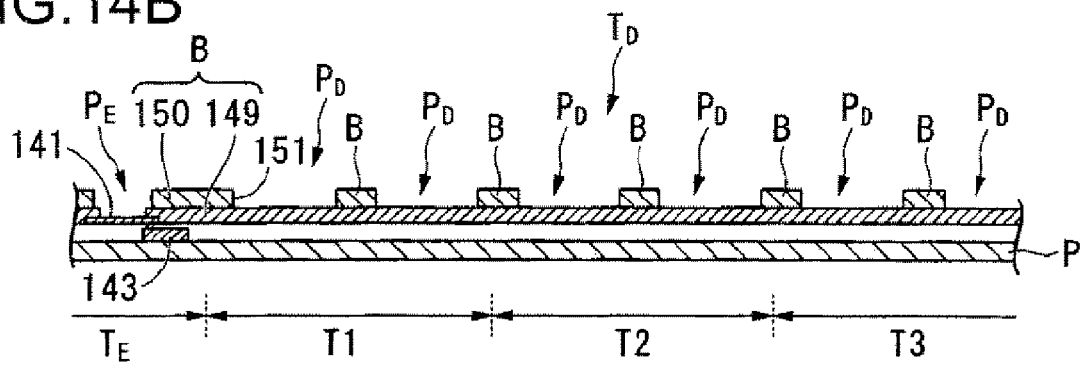

Next, as illustrated in FIG. 14B, the organic bank 150 made of an organic insulating material such as acrylic, polyimide, or the like is formed on the inorganic bank 149.

In conjunction with the inorganic bank 149, the organic bank 150 forms the bank (i.e., the partition) B that defines the organic EL element 200. That is, in the effective optical area $T_E$, each area defined by the inorganic bank 149 and the organic bank 150 corresponds to the liquid reception portion according to this embodiment of the invention, and each of these liquid reception portions becomes the effective pixel $P_E$. On the other hand, in the dummy area $T_D$, where the inorganic bank 149 is not subjected to patterning, each area defined by the organic bank 150 corresponds to the liquid reception portion according to this embodiment of the invention, and each of these liquid reception portions becomes the dummy pixel $P_D$.

The size of the dummy pixel $P_D$ (i.e., the area of the opening 151 of the bank B) is larger than the size of the effective pixel $P_E$. In other words, the dummy pixel $P_D$ is so formed as to be capable of holding a larger amount of the functional fluid than the effective pixel, so that the drying of the functional fluids progress evenly throughout the effective optical area.

The height of the organic bank 150 is set to approximately 1 μm to 2 μm, for example, and the organic bank 150 functions as a partition member of the organic EL element 200 above the base substrate P. According to such an arrangement, each opening 151 is formed because of a sufficient difference in height between a place where the hole injection layer, the luminescent layer, etc., of the organic EL element 200 are formed (i.e., a position where materials for forming them are applied) and the organic bank 150 that surrounds that place. The opening 151 of the organic bank 150 and the opening 149b of the inorganic bank 149 communicate with each other, and the pixel electrode 141 is exposed within these openings.

The intervals between adjacent openings 151 of the organic bank 150 (i.e., the alignment pitches of adjacent openings 151) in the X and Y directions are the same for both the effective pixels $P_E$ and the dummy pixels $P_D$. In other words, both of the effective pixels $P_E$ and the dummy pixels $P_D$ are formed so as to have the same density, but the arrangement density of the dummy pixels may be different between the areas T1, T2, and T3.

When forming the organic bank 150, it is desirable that a wall surface of the opening 151 of the organic bank 150 be formed so as to be slightly recessed outwardly relative to the opening 149b of the inorganic bank 149. By making a part of the inorganic bank 149 exposed within the opening 151 of the organic bank 150 in such a manner, the liquid material is made capable of spreading satisfactorily inside the organic bank 150.

After the formation of the organic bank 150, the liquid-repellency imparting treatment is performed in connection with the area including the organic bank 150 and the pixel electrode 141 above the base substrate. Because the organic bank 150 functions as the partition member that defines a boundary of the organic EL element 200, it is preferable that the organic bank 150 exhibit disaffinity (i.e. repellency) for the functional fluid discharged from the droplet discharge head 20. As to the liquid-repellency imparting treatment, the treatments as mentioned in the first embodiment can be employed. By such a liquid-repellency imparting treatment, it is possible to selectively allow the organic bank 150 to exhibit the disaffinity for the functional fluid.

The surface of the pixel electrode 141 formed by an ITO or metal film made of an inorganic material is less inclined to become liquid-repellent than the surface of the organic bank 150 made of an organic material. Therefore, even if the above-described liquid-repellency imparting treatment is applied to the entire region over the base substrate P, only the surface of the organic bank 150 is selectively made liquid-repellent, so that a plurality of areas having a different level of affinity for the functional fluid are formed within the areas enclosed by the organic bank 150.

Note that, prior to the liquid-repellency imparting treatment, the liquid-affinity imparting treatment may be applied to the surfaces of the inorganic bank 149 and the pixel electrode 141. As to the liquid-affinity imparting treatment, the liquid-affinity imparting treatments mentioned in the first embodiment can be employed. In the case where the $O_2$ plasma treatment is applied as the liquid-affinity imparting treatment, adjustment of the work function and cleaning of ITO, i.e., the pixel electrode 141 can also be achieved at the same time. In the case where the liquid-repellency imparting treatment is performed after the liquid-affinity imparting treatment, the surfaces of the pixel electrode 141 and the inorganic bank 149 are also affected by the liquid-repellency imparting treatment. However, the effect of the liquid-repellency imparting treatment on the pixel electrode 141 and the inorganic bank 149 are small as compared to on the organic bank 150. Therefore, wettability thereof is affected only slightly.

Figure 14C:
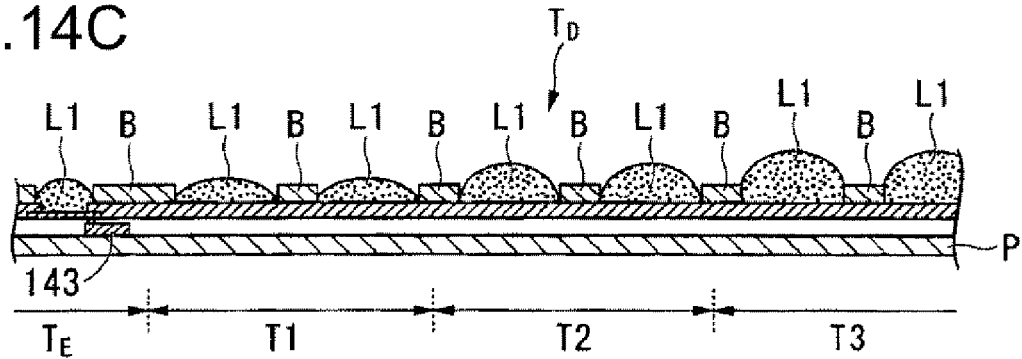

After the bank B is formed above the base substrate P, functional fluids L1 for forming the hole injection layer 140A are selectively applied, using the droplet discharge head, onto application positions defined by the bank B (in the dummy area $T_D$, the areas enclosed by the organic bank 150) as illustrated in FIG. 14C. The functional fluid L1 is a material for forming the hole injection layer dissolved or dispersed in a solvent.

Examples of the material for forming the hole injection layer include polyphenylenvinylene whose polymer precursor is polytetrahydrothiophenyl-phenylene, 1,1-bis-(4-N,N-ditolylaminophenyl)cyclohexane, tris(8-hydroxy-quinolinol)aluminum, polystyrene sulfonic acid, a mixture of polyethylene dioxythiophene and polystyrene sulfonic acid (PEDOT/PSS), and the like. Examples of the solvent include polar solvents such as isopropyl alcohol, N-methylpyrrolidone, 1,3-dimethyl-imidazolinone, and the like.

Larger amounts of the functional fluid L1 (especially, of the solvent therein) are discharged onto the dummy pixels $P_D$ in areas that are more distant from the center of the effective optical area $T_E$. The reason for this is that, because the droplets in areas that are more distant from the center of the effective optical area $T_E$ dry at higher rates, if the same amount of the solvent is discharged onto all dummy pixels $P_D$, unevenness in drying time may occur at the corner portions of the effective optical area $T_E$, resulting in failure of uniform drying. In contrast, in the case where the amounts of the solvent to be discharged are adjusted depending on the distance from the center C of the effective optical area $T_E$, variations in duration period of the solvent do not occur within the effective optical area $T_E$, making it possible to form, throughout the effective optical area, high-quality films without unevenness in film thickness or film inclination.

When the functional fluid L1 has been discharged from the droplet discharge head onto the base substrate P, the functional fluid L1 tends to spread in horizontal directions because of its fluidity, but since the bank B has been formed to enclose the position where the functional fluid L1 has been applied, the functional fluid L1 does not spread beyond the bank B to an outside thereof. In addition, because the surfaces of the pixel electrode 141 and the inorganic bank 149 maintain excellent affinity for liquid, the functional fluid L1 discharged onto them spreads throughout the entire surface of the pixel electrode and the like, resulting in formation of an even film.

Figure 14D:
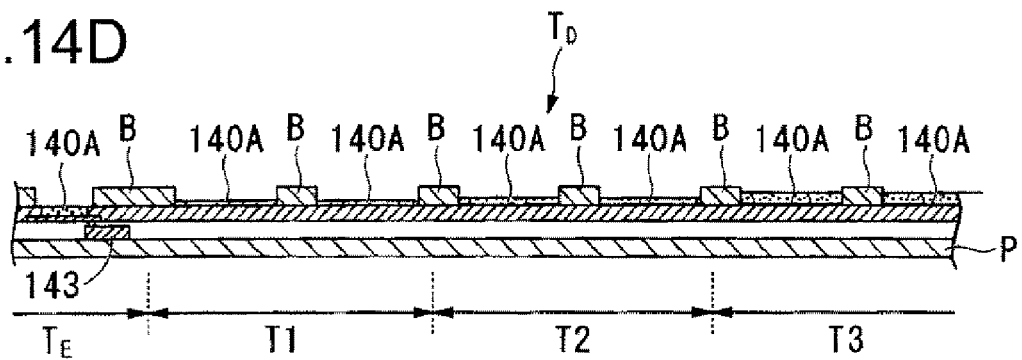

After the functional fluid L1 is arranged above the base substrate P, the solvent of the functional fluid L1 is evaporated by heating or light irradiation to form the solid hole injection layer 140A (i.e., a film pattern) on the pixel electrode 141 as illustrated in FIG. 14D. Alternatively, calcination may be performed in atmospheric environment or under an atmosphere of nitrogen gas at a predetermined temperature for a predetermined time. Still alternatively, the solvent may be removed by placing it under a pressure lower than atmospheric pressure (i.e., under a reduced pressure).

At this time, since larger amounts per unit area of the dummy functional fluid L1 are discharged onto areas that are more distant from the center of the effective optical area $T_E$, the partial pressure of the solvent molecules is not reduced abruptly even at the corner portions of the effective optical area $T_E$, where drying progresses rapidly, and therefore, the drying rate becomes equalized throughout the effective optical area. As a result, the hole injection layer 140A to be obtained is uniform in film thickness and quality and also excellent in surface flatness.

Figure 15A:
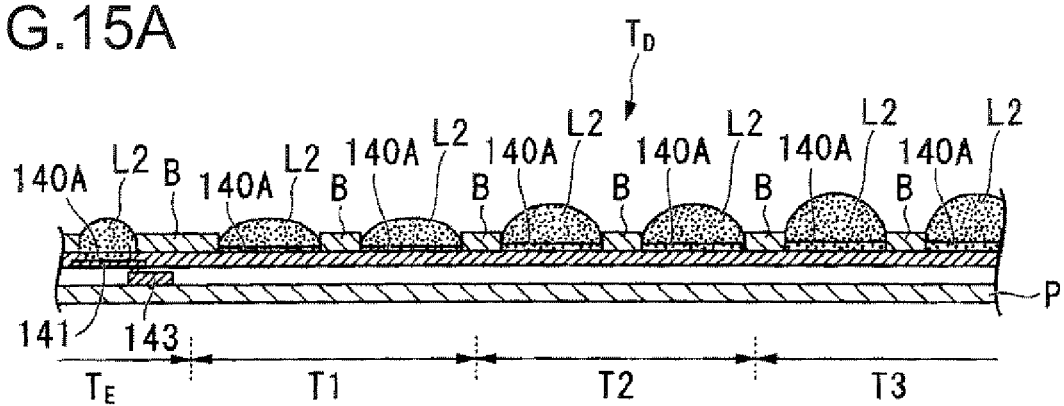
FIGS. 15A to 15C are process drawings illustrating processes subsequent to the processes of FIGS. 14A to 14D.

Next, as illustrated in FIG. 15A, a functional fluid L2 for forming the luminescent layer 140B is selectively applied, using the droplet discharge head, onto the hole injection layer 140A inside the bank B. The functional fluid L2 is a material for forming the luminescent layer dissolved or dispersed in a solvent.

As the material for forming the luminescent layer, known high molecular weight light-emitting materials capable of emitting fluorescence or phosphorescence can be suitably employed, e.g., polyfluorene derivatives (PF) polyparaphenylene-vinylene derivatives (PPV), polyphenylene derivatives (PP), polyparaphenylene derivatives (PPP), polyvinylcarbazole (PVK), polythiophene derivatives, polydialkylfluorene (PDAF), polyfluorenebenzothiadiazole (PFBT), polyalkylthiophene (PAT), and polysilanes such as polymethylphenylsilane (PMPS) and the like. Further, the above light-emitting materials may be doped with a high molecular weight material (such as a perylene pigment, a coumarin pigment, a rhodamine pigment, or the like) or a low molecular weight material (such as rubrene, perylene, 9,10-diphenylanthracene, tetraphenylbutadiene, Nile required, coumarin 6, quinacridone, or the like).

Preferably, the material for forming the luminescent layer is dissolved or dispersed in a polar solvent, and the resultant liquid material is discharged from the droplet discharge head. The polar solvent is capable of easily allowing the light-emitting material and the like to be dissolved or evenly dispersed therein, and therefore, it is possible to prevent a solid component within the material for forming the luminescent layer from causing adhesion or clogging within a nozzle hole of the droplet discharge head.

Specific examples of such polar solvents include water, alcohols that are compatible with water, such as methanol, ethanol, and the like, organic solvents such as N,N-dimethylformamide (DMF), N-methylpyrrolidone (NMP), dimethylimidazoline (DMI), dimethylsulfoxide (DMSO), xylene, cyclohexylbenzene, 2,3-dihydrobenzofuran, and the like, inorganic solvents, and suitable mixtures of two or more types of these solvents.

Formation of the luminescent layer 140B is achieved by discharging a functional fluid containing a material for forming a luminescent layer that emits red luminescence, a functional fluid containing a material for forming a luminescent layer that emits green luminescence, and a functional fluid containing a material for forming a luminescent layer that emits blue luminescence onto respective corresponding effective pixels $P_E$.

FIG. 15A illustrates a process of discharging the functional fluid L2 onto a red effective pixel. In this process, the same functional fluid L2 is also discharged onto the dummy pixels $P_D$ just as the hole injection layer 140A has been formed. Note that in FIG. 15A, the functional fluid L2 is discharged onto all dummy pixels $P_D$. However, the functional fluid L2 may be discharged onto only some of the dummy pixels $P_D$.

Figure 15B:
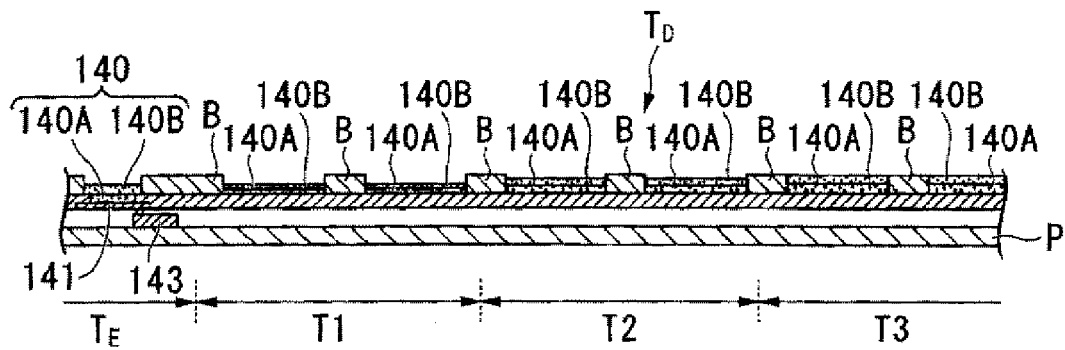

After the functional fluid L2 is discharged, the solvent within the functional fluid L2 is evaporated. As illustrated in FIG. 15B, as a result of this process, a solid red luminescent layer 140B (i.e., a film pattern) is formed on the hole injection layer 140A of the red effective pixel $P_E$. Thus, the organic functional layer 140 composed of the hole injection layer 140A and the luminescent layer 140B is obtained.

At this time, since the amounts and surface areas of the functional fluid arranged in the dummy area $T_D$ are controlled appropriately based on the distance from the center of the effective optical area $T_E$, the drying rate becomes equalized throughout the effective optical area $T_E$, resulting in uniform film thickness and quality. Moreover, since the upper surface of the hole injection layer 140A, on which the functional fluid L2 is arranged, has excellent flatness, the luminescent layer 140B formed thereon is also formed to have excellent flatness, and therefore, the luminescent layer has improved uniformity and excellent luminescent characteristics and reliability.

Figure 15C:
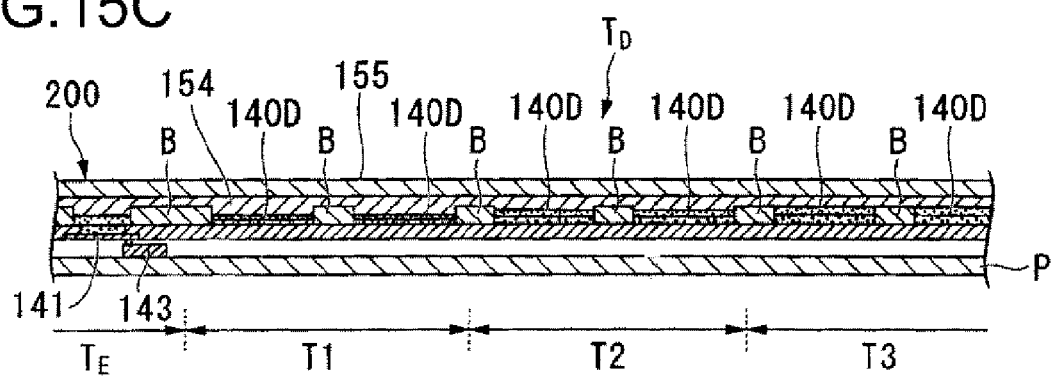

After the luminescent layer 140B is formed in all effective pixels $P_E$, the common electrode 154 made of ITO or the like is formed over the entire surface of the base substrate P, and a protective film 155 may be formed on the common electrode 154 as necessary, as illustrated in FIG. 15C. As a result, the organic EL element 200 is completed.

Note that, although in the dummy pixels $P_D$, the materials for forming the three (red, green, and blue) luminescent layers are formed, they are collectively denoted by reference numeral 140D in FIG. 15C.

In the method for manufacturing the organic EL device according to this embodiment, larger amounts per unit area and larger surface areas of the solvent held in the dummy area $T_D$ are set for areas that are more distant from the center of the effective optical area $T_E$. Thus, in the process of drying the functional fluids, it is possible to allow the rate at which the solvent is evaporated in the dummy area $T_D$ approach the rate at which the solvent is evaporated in the effective optical area $T_E$. Therefore, it becomes possible to form the hole injection layer and the luminescent layer with uniform thickness in both peripheral and central portions of the effective optical area $T_E$, which in turn makes it possible to easily provide a high-reliability organic EL device with little unevenness in element characteristics (i.e., display characteristics).

Third Embodiment

Next, as one embodiment of a method for manufacturing a device according to one embodiment of the invention, an exemplary method for manufacturing a color filter substrate to which a method for forming a film pattern according to one embodiment of the invention is applied will now be described. This color filter substrate can be suitably used as a color display unit of a liquid crystal display panel, for example.

Figure 16A:
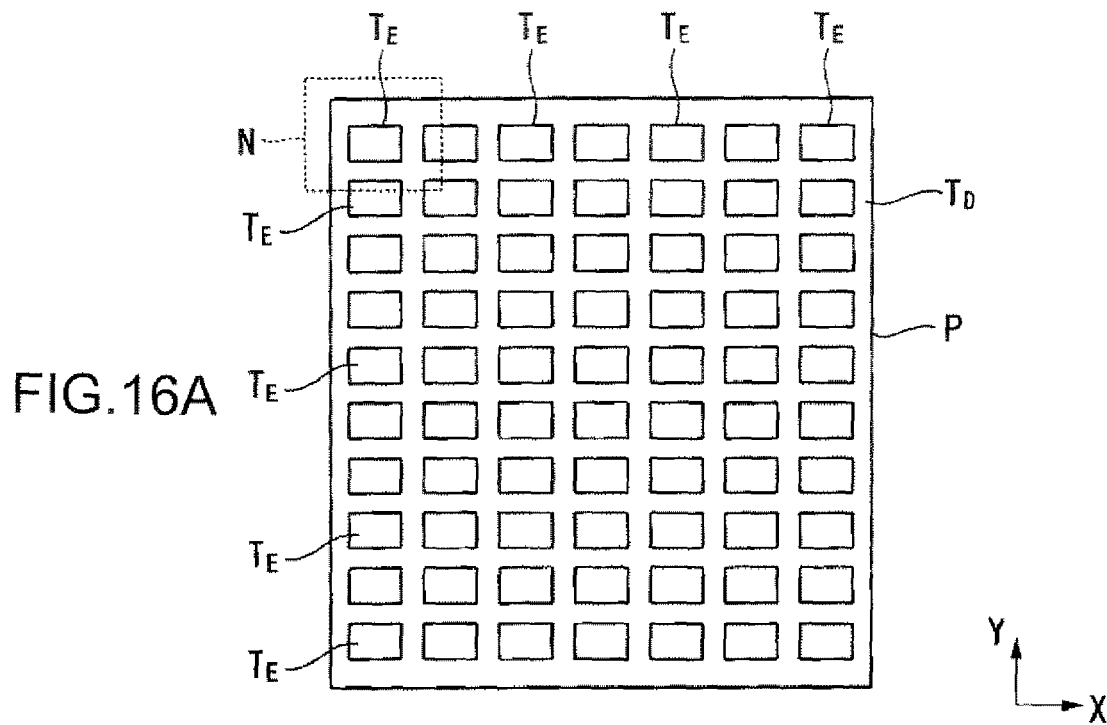
FIGS. 16A and 16B are conceptual diagrams illustrating a method for manufacturing a color filter substrate, which is an exemplary device according to one embodiment of the invention.
Figure 16B:
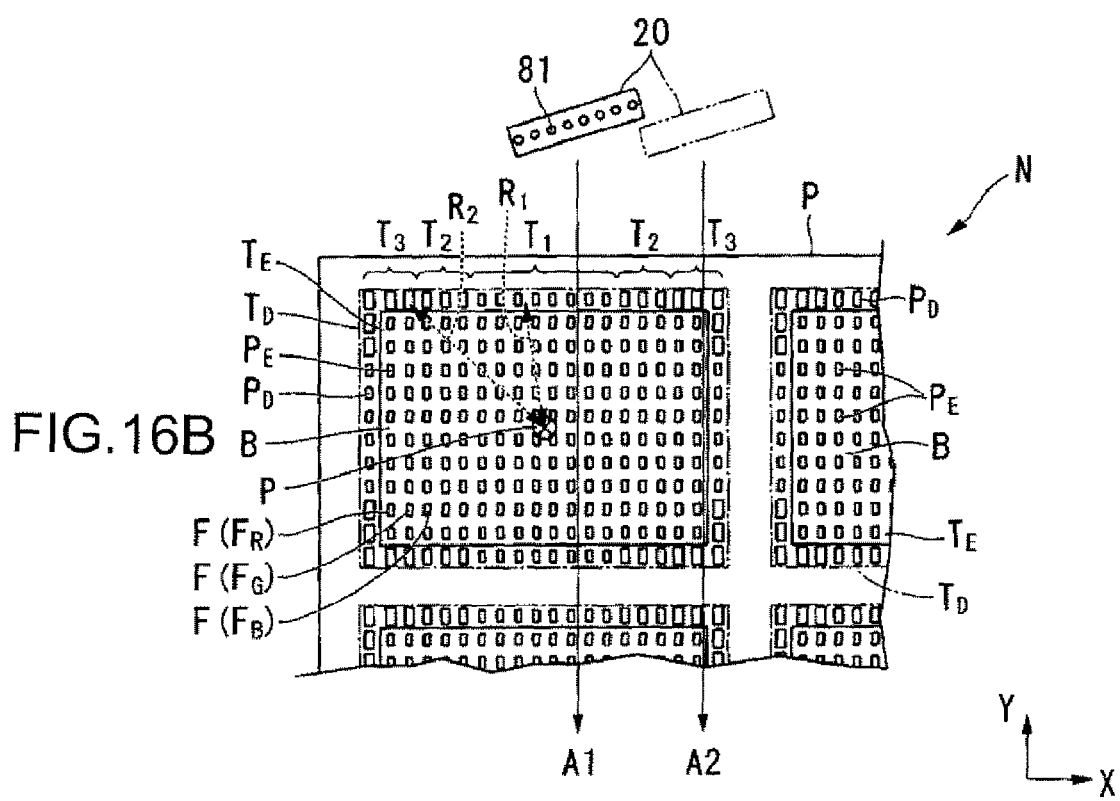

FIGS. 16A and 16B are conceptual diagrams illustrating a method for manufacturing the color filter substrate according to this embodiment.

In this method for manufacturing the color filter substrate, a plurality of color filters F ($F_R$, $F_G$, and $F_B$) are formed on the base substrate P made of glass, plastic, or the like using the above-described droplet discharge head 20. With the view of improving productivity, a substrate having a large area (i.e., a large-sized substrate) which is made of glass, plastic, or the like is employed as the base substrate P, and the plurality of color filters F arranged in a dot matrix are formed within panel areas $T_E$ formed on this large-sized substrate P.

Each panel area $T_E$ is an area where the color filters F used for display are formed, and corresponds to the effective area according to this embodiment. On the large-sized substrate P, an area outside the panel area $T_E$ is the dummy area (i.e., the non-effective area) $T_D$, which does not contribute to display. The banks (i.e., the partitions) B are formed in the panel area $T_E$ and the dummy area $T_D$, and each of the areas defined by the banks B is the liquid reception portion according to this embodiment. Of these liquid reception portions, liquid reception portions arranged in the panel area $T_E$ are the effective pixels $P_E$ and liquid reception portions arranged in the dummy area $T_D$ are the dummy pixels $P_D$. Each of the color filters F is formed by arranging a functional fluid containing a fine-particle coloring material such as a pigment in the effective pixel $P_E$, which is the liquid reception portion.

Each of the panel areas $T_E$, which can be separated by cutting the large-sized substrate P later, can be used as a color filter substrate suitable for use in a display panel. The panel area $T_E$ is provided with red color filters $F_R$ containing a red coloring material, green color filters $F_G$ containing a green coloring material, and blue color filters $F_B$ containing a blue coloring material. For example, as illustrated in FIG. 16B, the droplet discharge head 20 is caused to perform main scanning a plurality of times in a direction indicated by arrows A1 and A2, and during this main scanning, a functional fluid containing the red coloring material, a functional fluid containing the green coloring material, and a functional fluid containing the blue coloring material are selectively discharged from the plurality of nozzles 81 onto predetermined effective pixels $P_E$, whereby the color filters $F_R$, $F_G$, and $F_B$ are formed.

The color filter substrate is manufactured by arranging the red, green and blue color filters in an arrangement, such as a stripe pattern, a delta pattern, a mosaic pattern, or the like. More specifically, the formation of the color filters F using the droplet discharge head 20 as illustrated in FIG. 16B is achieved in the following manner: three types of droplet discharge heads 20 each of which is used to discharge a different color (i.e., one of red, green, and blue) are prepared beforehand, and these droplet discharge heads 20 are used by turns to form an arrangement of the three colors (i.e., red, green, and blue) on the large-sized substrate P.

FIGS. 17A to 17D illustrate a specific manufacturing procedure.

FIGS. 17A to 17D illustrate a boundary portion between the panel area $T_E$ and the dummy area $T_D$. In the panel area $T_E$, three effective pixels $P_E$ are shown, i.e., a red effective pixel where the red color filter $F_R$ is formed, a green effective pixel where the green color filter $F_G$ is formed, and a blue effective pixel where the blue color filter $F_B$ is formed.

Figure 17A:
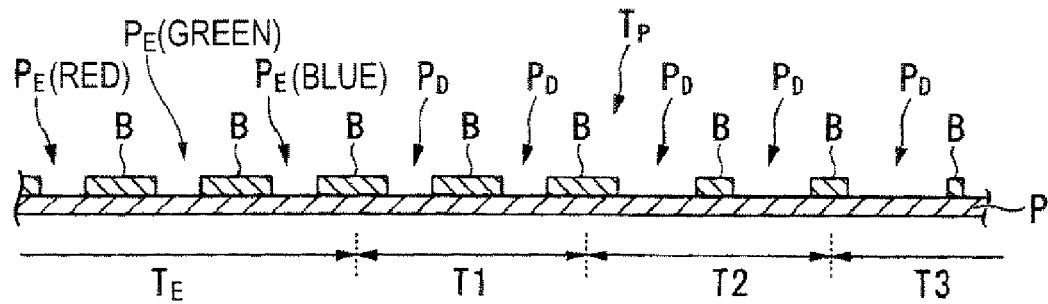
FIGS. 17A to 17D are process drawings illustrating an exemplary procedure for manufacturing the color filter substrate.

First, as illustrated in FIG. 17A, the banks B are formed on one surface of the large-sized substrate P.

The banks B function as a partition member for separating the areas where the color filters F are formed. The banks B are formed in the panel area $T_E$ and the area (i.e., the non-effective area) surrounding the panel area $T_E$. The banks B formed in the panel area $T_E$ have openings corresponding to a pixel pattern of the display panel. In the method for manufacturing the color filter substrate according to this embodiment, the functional fluid containing the coloring material is arranged in the areas defined by the banks B, and as a result of the drying of the functional fluid, the color filters (i.e., film patterns) F are formed on the large-sized substrate P. In this case, since the banks B define the shapes of the color filters F, miniaturization of the color filters F is aimed at by forming the banks B appropriately, such as making the interval between adjacent banks B shorter, for example.

The method for forming the banks B is identical to the method for forming the organic bank 150 in the second embodiment. That is, an organic insulating material, such as acrylic, polyimide, or the like, is arranged on the large-sized substrate P, and it is subjected to patterning by photolithography, whereby the banks B having a desired shape are formed. In the case where a material that is not translucent (e.g., black resin) is employed as the organic insulating material, it is possible to allow the banks B to function as a black matrix. The liquid-repellency imparting treatment may be applied to the surfaces of the banks B as necessary.

As illustrated in FIG. 16B, the sizes of the dummy pixels $P_D$ (i.e., the sizes of the openings of the banks B in the dummy area $T_D$) vary depending on the distance R1, R2 from the center C of the panel area $T_E$. Specifically, the size of the dummy pixels $P_D$ is the smallest in an area T1, which is the closest to the center C, and the more distant the dummy pixels $P_D$ are from the center C, the larger the size of the dummy pixels $P_D$ becomes. That is, larger amounts per unit area and larger surface areas of the functional fluid held in the dummy area $T_D$ are set for areas that are more distant from the center C of the panel area $T_E$. This makes it possible for the drying of the functional fluid to progress evenly throughout the entire panel area.

The sizes of the dummy pixels $P_D$ have a plurality of levels, the first level for a central portion of a side edge of the panel area $T_E$ and the last level for a corner portion of the panel area $T_E$. More specifically, the plurality of areas T1, T2, and T3 are provided along a side edge of the panel area $T_E$, the sizes of the dummy pixels $P_D$ are different between the areas T1, T2, and T3 but the same within each area, and areas with the dummy pixels $P_D$ of larger sizes are placed at positions that are more distant from the center of the panel area $T_E$. The size of the dummy pixels $P_D$ within each area T1, T2, or T3 and the proportion of each area T1, T2, or T3 in the entire dummy area $T_D$ are determined properly so that the drying rate of the functional fluid becomes equal throughout the panel area.

Note that in FIGS. 17A to 17D, the banks B have a single-layer structure formed of an organic layer. However, the banks B may have a two-layer structure formed of an inorganic layer and an organic layer as with the banks B in the first embodiment.

Figure 17B:
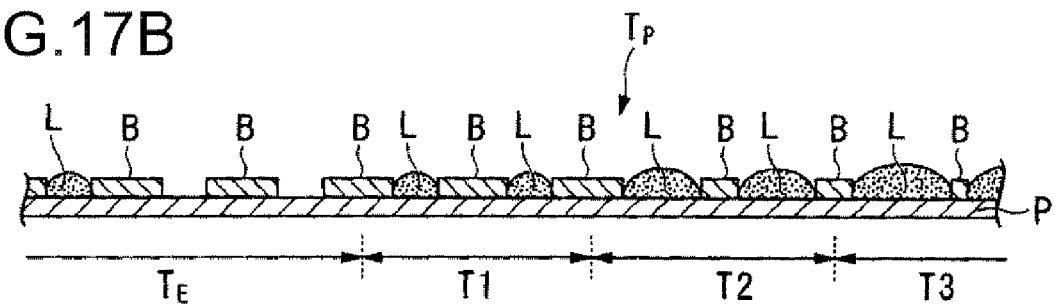

After the formation of the banks B, the functional fluid L containing the coloring material is selectively discharged, using the droplet discharge head, onto the areas defined by the banks B as illustrated in FIG. 17B. The functional fluid L is the coloring material such as a pigment dissolved or dispersed in a solvent.

The discharge of the functional fluid is performed by discharging the functional fluid containing the red coloring material, the functional fluid containing the green coloring material, and the functional fluid containing the blue coloring material onto their respective corresponding effective pixels $P_E$.

FIG. 17B illustrates a process of discharging the functional fluid L onto the red effective pixel. In this process, the same functional fluid L is also discharged onto the dummy pixels $P_D$. Note that in FIG. 17B, the functional fluid L is discharged onto all dummy pixels $P_D$, but it may be discharged onto only some of the dummy pixels $P_D$.

Larger amounts of the functional fluid L (especially, of the solvent therein) are discharged onto the dummy pixels $P_D$ in areas that are more distant from the center C of the effective optical area $T_E$. The reason for this is that, because the droplets in areas that are more distant from the center of the effective optical area $T_E$ dry at higher rates, if the same amount of the solvent is discharged onto all dummy pixels $P_D$, unevenness in drying time may occur at the corner portions of the effective optical area $T_E$, resulting in failure of uniform drying. In the present embodiment, because the sizes of the dummy pixels $P_D$ are larger in areas that are more distant from the center C of the panel area $T_E$, a problem of the overflow of the discharged functional fluid L from the openings of the banks B or the like does not occur even in the dummy pixels $P_D$ which are far from the center C.

Figure 17C:
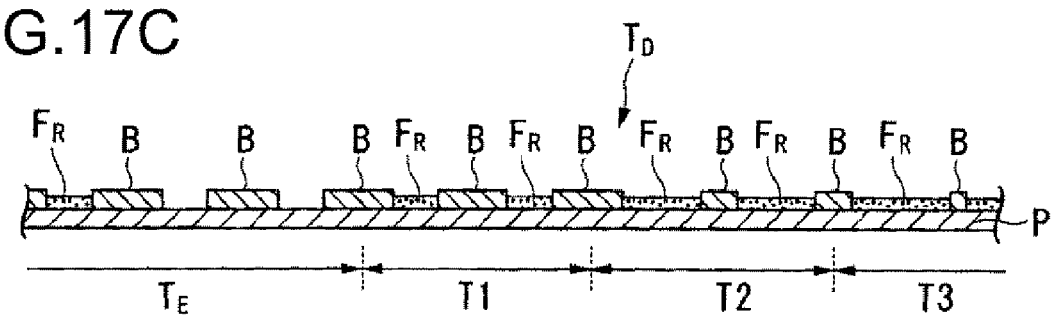

After the discharge of the functional fluid L, the solvent within the functional fluid L is evaporated. As a result of this process, a solid red color filter $F_R$ is formed in the red effective pixel $P_E$ as illustrated in FIG. 17C. At this time, because the amounts and surface areas of the functional fluid arranged in the dummy area $T_D$ are controlled appropriately in accordance with the distance from the center C of the panel area $T_E$, the drying rate becomes equalized throughout the panel area $T_E$, resulting in uniform film thickness and quality.

Figure 17D:
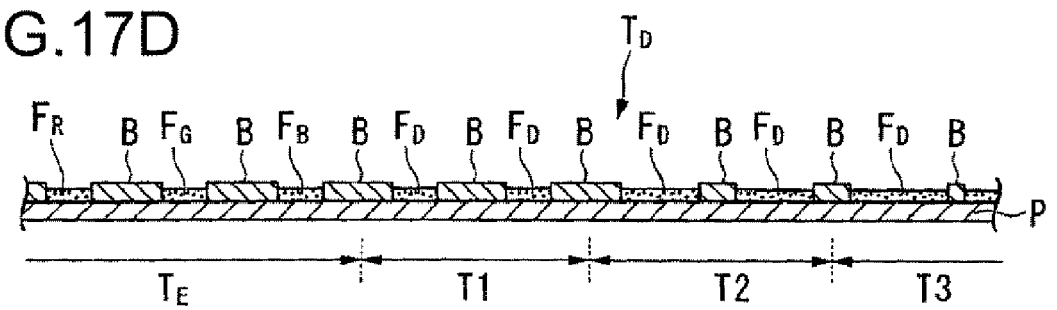

After the formation of the red color filters $F_R$ in the red effective pixels, by a similar process, the green color filters $F_G$ are formed in the green effective pixels, and further, the blue color filters $F_B$ are formed in the blue effective pixels. FIG. 17D illustrates a state where the color filters have been formed in all effective pixels $P_E$. Note that although the three coloring materials (i.e., the red, green, and blue coloring materials) are formed in the dummy pixels $P_D$, they are collectively denoted by reference numeral $F_D$ in FIG. 17D.

After the color filters F are formed in all effective pixels $P_E$, a protective film may be formed on surfaces of the color filters F as necessary.

After that, the large-sized substrate P is cut along scribe lines provided between the panel areas $T_E$, whereby individual color filter substrates are acquired. Thus, the manufacture of the color filter substrate is completed.

In the method for manufacturing the color filter substrate according to the present embodiment, because larger amounts per unit area of the functional fluid held in the dummy area $T_D$ are set for areas that are more distant from the center of the panel area $T_E$, variations in drying rate do not occur between a peripheral and a central portion of the panel area $T_E$, and it is possible to form the color filters F with uniform thickness throughout the entire panel area. Thus, it is possible to provide a color filter substrate with excellent display performance and which causes little unevenness in color. In addition, because it is possible to form the color filters F so as to be flat, in the case where electrodes are formed thereon, the color filter substrate has excellent reliability, being less likely to cause snapping of a wire or the like.

EXAMPLES

Next, examples of the method for forming a film pattern according to embodiments of the invention will now be described.

Figure 18A:
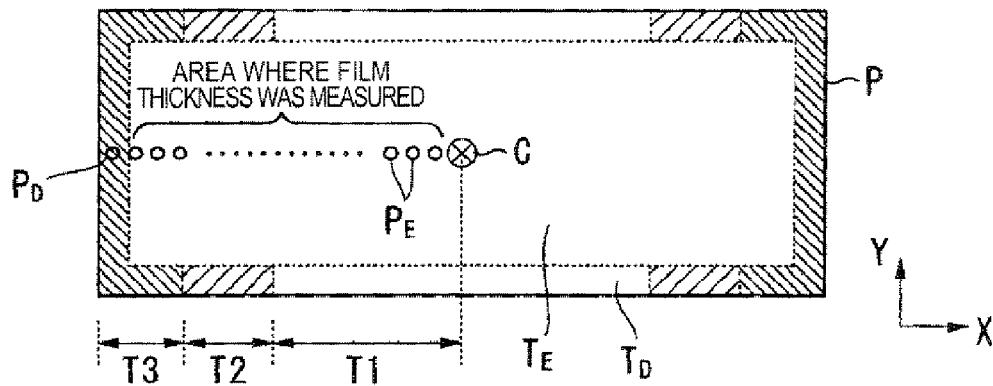
FIGS. 18A to 18C are plan views of sample substrates according to examples.
Figure 18B:
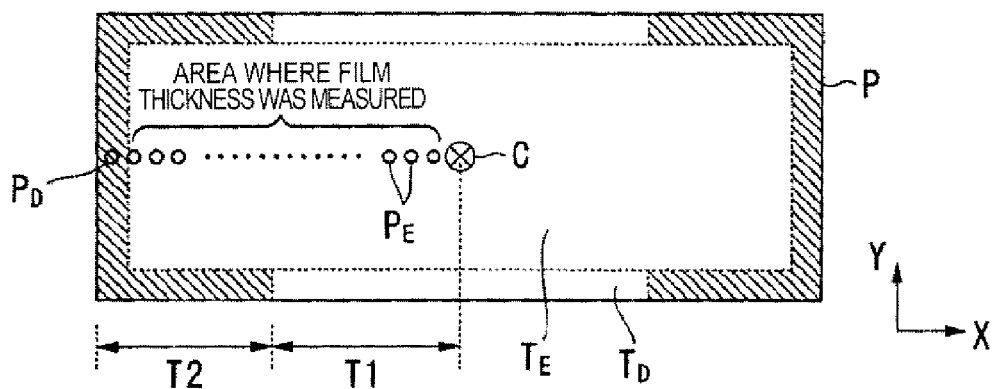
Figure 18C:
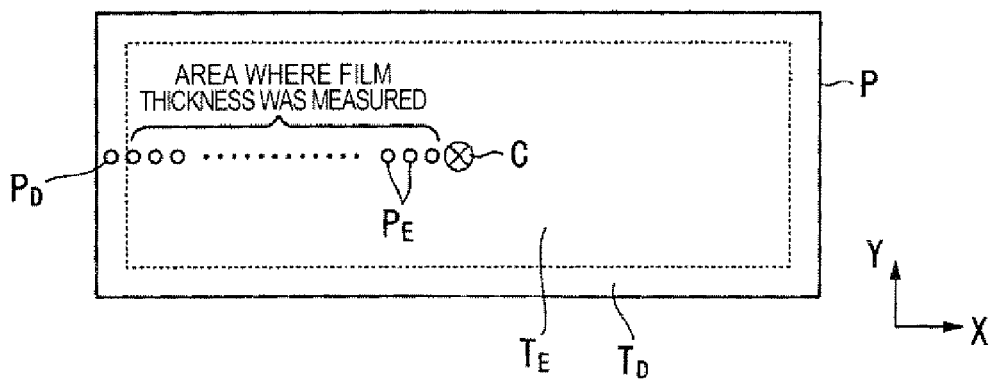

FIGS. 18A to 18C are schematic plan views illustrating arrangements of the effective pixels $P_E$ and the dummy pixels $P_D$ formed on a sample substrate P. Specifically, FIG. 18A is a schematic view in the case where the amount of the functional fluid (especially, of the solvent therein) discharged onto the dummy pixels $P_D$ is divided into three levels, one level for the central portion of a side edge of the effective area $T_E$, another level for a corner portion of the effective area $T_E$, and the remaining, intermediate level for a portion intermediate between those two portions (sample 1). FIG. 18B is a schematic view in the case where the amount of the functional fluid discharged onto the dummy pixels $P_D$ is divided into two levels, one level for the central portion of a side edge of the effective area $T_E$ and the other level for a corner portion of the effective area $T_E$ (sample 2). FIG. 18C is a schematic view in the case where the amount of the functional fluid discharged onto the dummy pixels $P_D$ is the same as the amount of the functional fluid discharged onto the effective pixels $P_E$ (sample 3). In each sample, the shape, size, and pitch of the effective pixels are the same as those of the dummy pixels.

In sample 1, the amount of the functional fluid discharged onto the dummy pixels $P_D$ is divided into three levels, one level for the central portion of the side edge of the effective area $T_E$, another level for the corner portion of the effective area $T_E$, and the remaining, intermediate level for the portion intermediate between those two portions. In an area T1, which is close to the center C of the effective area $T_E$, the amount of the functional fluid discharged onto each dummy pixel $P_D$ is 50 ng. In an area T3, which is the most distant from the center C of the effective area $T_E$, the amount of the functional fluid discharged onto each dummy pixel $P_D$ is 120 ng. In an area T2, which is intermediate between the area T1 and the area T3, the amount of the functional fluid discharged onto each dummy pixel $P_D$ is 80 ng. Note that the amount of the functional fluid discharged onto each effective pixel $P_E$ is the same as the amount of the functional fluid discharged onto each dummy pixel $P_D$ in the area T1.

In sample 2, the amount of the functional fluid discharged onto the dummy pixels $P_D$ is divided into two levels, one level for the central portion of the side edge of the effective area $T_E$ and the other level for the corner portion of the effective area $T_E$. In an area T1, which is close to the center C of the effective area $T_E$, the amount of the functional fluid discharged onto each dummy pixel $P_D$ is 50 ng. In an area T2, which occupies the remaining portion of the dummy area $T_D$, the amount of the functional fluid discharged onto each dummy pixel $P_D$ is 80 ng. Note that the amount of the functional fluid discharged onto each effective pixel $P_E$ is the same as the amount of the functional fluid discharged onto each dummy pixel $P_D$ in the area T1.

In sample 3, the amount of the functional fluid discharged onto each dummy pixel $P_D$ is the same as the amount of the functional fluid discharged onto each effective pixel $P_E$. This arrangement is the same as that adopted heretofore in related art.

In the present examples, the functional fluid is discharged onto the effective pixels $P_E$ and the dummy pixels $P_D$ of each of the samples 1 to 3 and dried thereafter, whereby a film pattern is formed within the effective area. The functional fluid used is PEDOT/PSS dissolved in a mixed solvent of water (vapor pressure: 2338 Pa, 20° C.) and diethylene glycol (vapor pressure: 1.3 Pa, 20° C.). The drying of the functional fluid is performed under controlled pressure in a decompression chamber.

The discharge amounts for the dummy pixels $P_D$ in each of the samples 1 and 2 are determined so that the difference in drying time of the functional fluid between the central and corner portions of the effective area $T_E$ becomes sufficiently small.

Figure 19A:
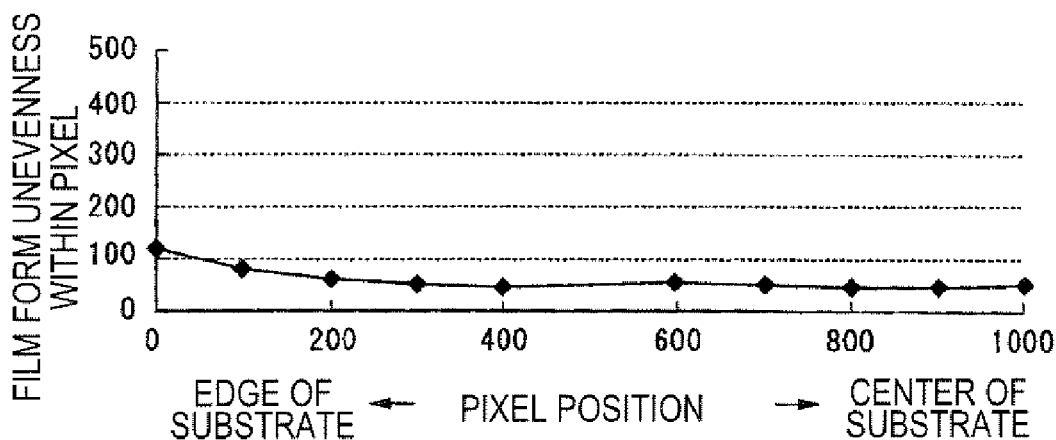
FIGS. 19A to 19C are profiles of film patterns obtained by drying the functional fluid.
Figure 19B:
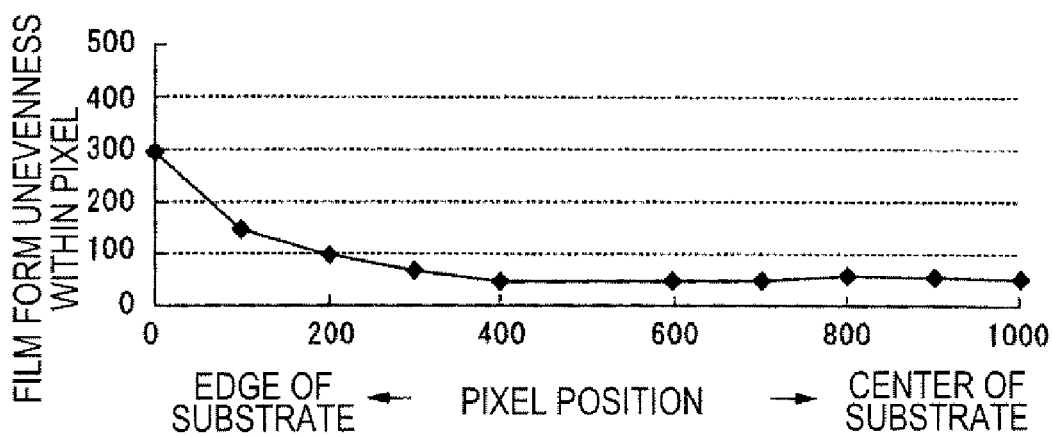
Figure 19C:
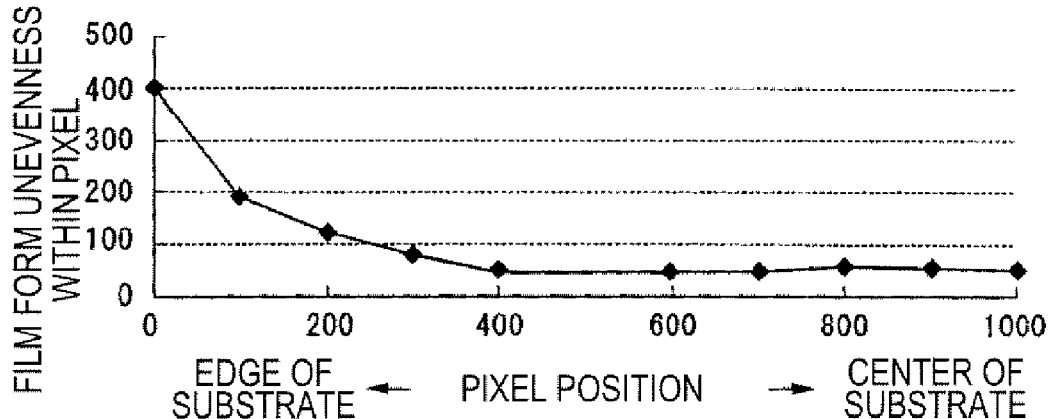

FIGS. 19A to 19C are diagrams illustrating the degree of non-uniformity in film thickness within the effective area $T_E$. FIG. 19A, FIG. 19B, and FIG. 19C correspond to sample 1, sample 2, and sample 3, respectively. In FIGS. 19A to 19C, a horizontal axis indicates the distance from the center C of the effective area $T_E$, and a vertical axis indicates the degree of non-uniformity in film thickness within one effective pixel. The degree of non-uniformity in film thickness is measured by a difference in film thickness between a point where the film thickness is largest and a point where the film thickness is smallest within one effective pixel. Note that the unit of the vertical axis is angstrom (Å).

As shown in FIG. 19C, in sample 3, an edge portion (as viewed in the longitudinal direction) of the effective area $T_E$ exhibits a large degree of non-uniformity in film thickness. This shows that simply providing the dummy area $T_D$ does not eliminate the unevenness in film thickness to a sufficient extent. Meanwhile, as shown in FIG. 19B, in sample 2, the edge portion exhibits a smaller degree of non-uniformity in film thickness. This shows that varying the amount of the dummy functional fluid between the central and edge portions of the effective area $T_E$ is effective in improving the uniformity in film thickness within the effective area $T_E$. In particular, as shown in FIG. 19A, in sample 1, the effective area $T_E$ exhibits almost no non-uniformity in film thickness. This shows that if the discharge amount of the dummy functional fluid is adjusted with three or more levels of the discharge amount set, a pattern can be formed with substantially uniform film thickness.

Electronic Device

Next, a specific example of an electronic device according to one embodiment of the invention will now be described.

Figure 20:
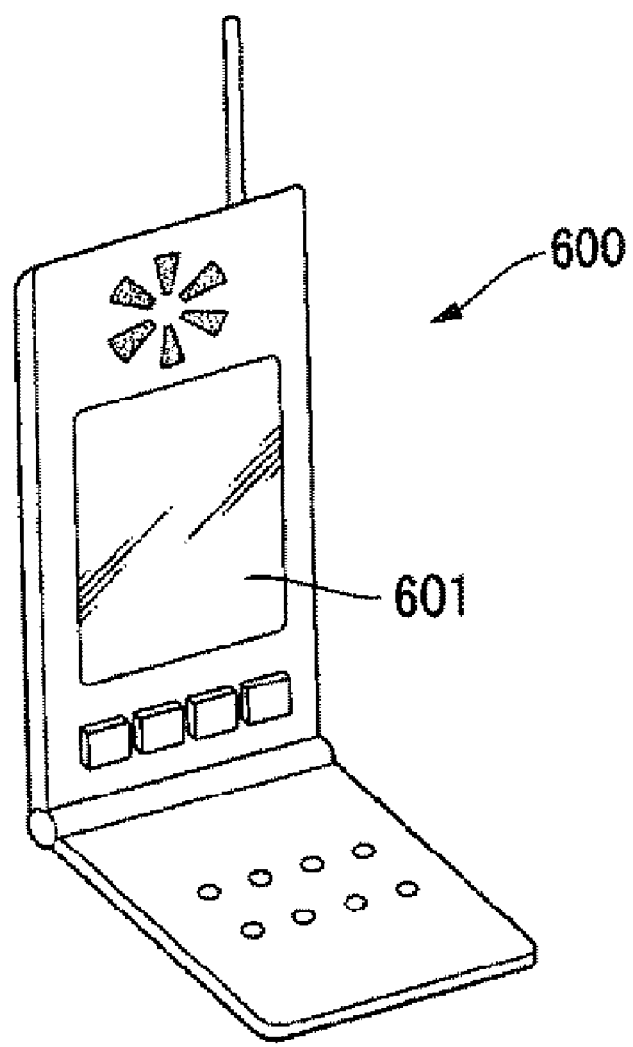
FIG. 20 is a perspective view of an exemplary electronic device including the film pattern according to one embodiment of the invention.

FIG. 20 is a perspective view of an exemplary mobile phone. In FIG. 20, reference numeral 600 indicates a body of the mobile phone, and reference numeral 601 indicates a display unit provided with the organic EL device or the color filter substrate according to the above-described embodiments.

The electronic device as illustrated in FIG. 20 has the film pattern formed by the method for forming a film pattern according to the above-described embodiment of the invention, and therefore has excellent display quality and performance.

Note that devices such as the organic EL device, the color filter substrate, and the like according to the embodiments of the invention can be installed in not only a mobile phone but also various electronic devices. Examples of such electronic devices include an electronic book player, a personal computer, a digital still camera, a liquid crystal television, a video tape recorder with a view finder, a video tape recorder with a monitor, a car navigation device, a pager, an electronic organizer, an electronic calculator, a word processor, a workstation, a videophone, a POS terminal, and a device equipped with a touch panel.

Preferred embodiments of the invention have been described above with reference to the accompanying drawings. Needless to say, the invention is not limited to those exemplary embodiments. Forms, combinations, etc., of the components described in connection with the above-described exemplary embodiments are illustrative and not restrictive. It is understood that numerous other modifications and variations can be devised based on design requirements and the like without departing from the scope of the invention.

Also, in the above-described exemplary embodiments, examples where the method for forming a film pattern according to one embodiment of the invention is applied to the method for manufacturing an organic EL device and the method for manufacturing a color filter substrate have been described. However, the invention is not limited to those examples but applicable to a method for manufacturing any device having a plurality of film patterns within a predetermined area. In the case of the organic EL device as described above, the invention is applicable not only to patterning of the hole injection layer 140A and the luminescent layer 140B but also to patterning of the pixel electrodes 141. The method for forming a film pattern according to the invention is also applicable to formation of various wires including the signal lines 132, the scan lines 131, or the common power supply lines 133 and to formation of a plurality of terminal electrodes that connect the flexible substrate 75 and the base substrate P.

What is claimed is:

1. A method for forming a film pattern by arranging a functional fluid on a base substrate and drying the functional fluid, the functional fluid including a solvent, the method comprising:

forming a plurality of liquid reception portions on the base substrate, the plurality of liquid reception portions being formed in a first area located proximate a center of the base substrate and a second area of the base substrate that entirely peripherally surrounds the first area and is located at peripheral edges of the base substrate;

depositing droplets of the functional fluid in the liquid reception portions formed in the first area; and depositing droplets of the functional fluid or the solvent in the liquid reception portions formed in the second area, wherein, in the second area, an amount of the solvent that is deposited in the liquid reception portions increases as a distance between the respective liquid reception portion and the center of the base substrate increases.

2. The method for forming a film pattern according to claim 1, wherein the second area includes a first region proximate the first area, a second region distal the first area compared to the first region, and a third region distal the second region, and an amount of solvent deposited in the third region is greater than amounts of solvent deposited in the second and first regions, and the amount of solvent deposited in the second region is greater than the amount of solvent deposited in the first region.

3. The method for forming a film pattern according to claim 1, wherein the first and second areas are rectangular, and an amount of the solvent is largest in the liquid reception portions located at corner portions of the rectangular second area.

4. The method for forming a film pattern according to claim 1, wherein the liquid reception portions are areas defined by partitions.

5. The method for forming a film pattern according to claim 1, wherein a size of the liquid reception portions in the first area is substantially identical to a size of the liquid reception portions in the second area.

6. The method for forming a film pattern according to claim 1, wherein a size of the liquid reception portions in the second area is larger than a size of the liquid reception portions in the first area.

7. The method for forming a film pattern according to claim 1, wherein, in the second area, a size of the liquid reception portions increases as the distance between the respective liquid reception area and the center of the base substrate increases.

8. The method for forming a film pattern according to claim 1, wherein an interval between adjacent liquid reception portions in the first area is substantially identical to an interval between adjacent liquid reception portions in the second area.

9. The method for forming a film pattern according to claim 1, wherein the liquid reception portions in the second area are formed in at least two rows along a periphery of the first area.

10. The method for forming a film pattern according to claim 1, wherein arrangement of the functional fluid or the solvent is performed employing a droplet discharge method.

11. The method of claim 1, wherein, in the second area, each droplet of functional fluid consists of solvent.

* * * * *